(12) United States Patent
Wu et al.

(10) Patent No.: US 12,375,809 B2
(45) Date of Patent: Jul. 29, 2025

(54) DRIVING MECHANISM

(71) Applicant: TDK TAIWAN CORP., Taoyuan (TW)

(72) Inventors: Ya-Hsiu Wu, Taoyuan (TW); Yi-Ho Chen, Taoyuan (TW); Ying-Jen Wang, Taoyuan (TW)

(73) Assignee: TDK TAIWAN CORP., Taoyuan (TW)

( * ) Notice: Subject to any disclaimer, the term of this patent is extended or adjusted under 35 U.S.C. 154(b) by 735 days.

(21) Appl. No.: 17/556,090

(22) Filed: Dec. 20, 2021

(65) Prior Publication Data
US 2022/0197050 A1    Jun. 23, 2022

Related U.S. Application Data

(60) Provisional application No. 63/127,746, filed on Dec. 18, 2020.

(51) Int. Cl.
| | | |
|---|---|---|
| *H04N 23/68* | (2023.01) | |
| *G02B 7/04* | (2021.01) | |
| *G02B 7/09* | (2021.01) | |
| *G02B 13/00* | (2006.01) | |
| *G02B 26/00* | (2006.01) | |
| *G02B 26/08* | (2006.01) | |
| *G02B 27/64* | (2006.01) | |
| *G06F 3/01* | (2006.01) | |
| *H04N 23/54* | (2023.01) | |
| *H04N 23/57* | (2023.01) | |

(Continued)

(52) U.S. Cl.
CPC ............ *H04N 23/687* (2023.01); *G02B 7/04* (2013.01); *G02B 7/09* (2013.01); *G02B 13/0015* (2013.01); *G02B 26/00* (2013.01); *G02B 26/0875* (2013.01); *G02B 27/64* (2013.01); *G02B 27/646* (2013.01); *G06F 3/016* (2013.01); *H04N 23/54* (2023.01); *H04N 23/57* (2023.01); *H10N 30/101* (2024.05); *H10N 30/802* (2023.02)

(58) Field of Classification Search
CPC .... H04N 23/54; H04N 23/57; G02B 13/0015; G02B 7/04; G02B 7/09; G02B 26/00; G02B 26/0875; G02B 27/64; G02B 27/646; H10N 30/101; H10N 30/802; G06F 3/016
See application file for complete search history.

(56) References Cited

U.S. PATENT DOCUMENTS

2020/0089020 A1* 3/2020 Lee .................. G03B 11/04
2020/0213522 A1* 7/2020 Ochi ................ H02K 11/215
(Continued)

*Primary Examiner* — Twyler L Haskins
*Assistant Examiner* — John H Morehead, III
(74) *Attorney, Agent, or Firm* — MUNCY, GEISSLER, OLDS & LOWE, P.C.

(57) ABSTRACT

A driving mechanism is provided. The driving mechanism includes a fixed portion, a movable portion, a driving assembly, a circuit assembly, and a signal adjusting assembly. The movable portion is movable relative to the fixed portion. The driving assembly is used for driving the movable portion to move relative to the fixed portion. The driving assembly is used for receiving a first signal provided by a control assembly. The driving assembly is electrically connected to the control assembly by the circuit assembly. The signal adjusting assembly is electrically connected to the driving assembly. The signal adjusting assembly is used for adjusting the first signal.

12 Claims, 25 Drawing Sheets

(51) Int. Cl.
 *H10N 30/00* (2023.01)
 *H10N 30/80* (2023.01)

(56) References Cited

U.S. PATENT DOCUMENTS

2020/0225442 A1* 7/2020 Weng .................... H04N 23/54
2020/0326498 A1* 10/2020 Lee ..................... G02B 27/646

* cited by examiner

DRIVING MECHANISM

CROSS REFERENCE TO RELATED APPLICATIONS

This application claims the benefit of U.S. Provisional Application No. 63/127,746, filed on Dec. 18, 2020, the entirety of which is incorporated by reference herein.

BACKGROUND OF THE INVENTION

Field of the Invention

The present disclosure relates to a driving mechanism.

Description of the Related Art

As technology has developed, it has become more common to include image-capturing and video-recording functions into many types of modern electronic devices, such as smartphones and digital cameras. These electronic devices are used more and more often, and new models have been developed that are convenient, thin, and lightweight, offering more choice to consumers.

Electronic devices that have image-capturing or video-recording functions normally include a driving mechanism to drive an optical element (such as a lens) to move along its optical axis, thereby achieving auto focus (AF) or optical image stabilization (OIS). Light may pass through the optical element and may form an image on an optical sensor. However, the trend in modern mobile devices is to have a smaller size and a higher durability. As a result, how to effectively reduce the size of the driving mechanism and how to increase its durability has become an important issue.

BRIEF SUMMARY OF THE INVENTION

A driving mechanism is provided in some embodiments. The driving mechanism includes a fixed portion, a movable portion, a driving assembly, a circuit assembly, and a signal adjusting assembly. The movable portion is movable relative to the fixed portion. The driving assembly is used for driving the movable portion to move relative to the fixed portion. The driving assembly is used for receiving a first signal provided by a control assembly. The driving assembly is electrically connected to the control assembly by the circuit assembly. The signal adjusting assembly is electrically connected to the driving assembly. The signal adjusting assembly is used for adjusting the first signal.

In some embodiments, the driving assembly comprises a first driving element used for generating a first driving force to the movable portion, and a second driving element used for generating a second driving force to the movable portion. The circuit assembly comprises a first circuit and a second circuit. The first driving element and the second driving are electrically connected to the first circuit. The first driving element and the second driving are electrically connected to the second circuit. The first circuit is electrical connectable to the second circuit through the driving assembly. The first driving element is electrical connectable to the control assembly through the first circuit. The second driving element is electrical connectable to the control assembly through the first circuit. The first driving element is electrical connected to the control assembly through the second circuit. The second driving element is electrical connected to the control assembly through the second circuit.

In some embodiments, the circuit assembly further comprises a third circuit electrically connected to the first driving element, a fourth circuit electrically connected to the second driving element, and a main body being plate-shaped. The first circuit is electrically connectable to the second circuit through the third circuit. The first circuit is electrically connectable to the second circuit through the fourth circuit. The third circuit is electrically connected to the signal adjusting assembly. The signal adjusting assembly is electrically connected to the first circuit or the second circuit through the third circuit. The fourth circuit is electrically connected to the signal adjusting assembly. The signal adjusting assembly is electrically connected to the first circuit or the second circuit through the fourth circuit. The driving mechanism further comprises a first clamping element used for fixing a first end of the first driving element that is strip-shaped, and a second clamping element used for fixing a second end of the second driving element that is strip-shaped. The first clamping element is plate-shaped. The first clamping element is electrically connected to the third circuit. The second clamping element is plate-shaped. The second clamping element is electrically connected to the fourth circuit. The fixed portion further comprises a case and a bottom forming an accommodating space for accommodating the movable portion. The case comprises a top wall and a side wall. The circuit assembly is disposed in the accommodating space. The control assembly is disposed in the accommodating space. The first circuit, the second circuit, the third circuit, and the fourth circuit are disposed on the main body.

In some embodiments, the movable portion is used for connecting to an optical element. The first driving element comprises shape memory alloy. The second driving element comprises shape memory alloy. The control assembly further comprises a first sensing assembly and a second sensing assembly used for detecting the movement of the movable portion relative to the fixed portion. The control assembly provides the first signal based on the sensing result of the first sensing assembly. The control assembly provides the first signal based on the sensing result of the second sensing assembly.

In some embodiments, the signal adjusting assembly is used for adjusting the first signal to be a second signal, and then providing to the first driving element. The signal adjusting assembly is used for adjusting the first signal to be a third signal, and then providing to the second driving element. The second signal comprises positive voltage or current, or comprises negative voltage or current. The third signal comprises positive voltage or current, or comprises negative voltage or current. The signal adjusting assembly comprises a first electronic element and a second electronic element. The first electronic element has rectifying function. The first electronic element is electrically connected to the third circuit and the first driving element. The second electronic element has rectifying function. The second electronic element is electrically connected to the fourth circuit and the second driving element. When taking the first circuit as a standard, rectifying directions of the first electronic element and the second electronic element are opposite.

In some embodiments, the first signal comprises first information at a first timing. The first signal comprises second information at a second timing. The first timing and the second timing are at different times. The first signal that comprises the first information passes through the first electronic element to reach the first driving element during the first timing. The first signal that comprises the second information passes through the second electronic element to reach the second driving element during the second timing.

In some embodiments, the driving assembly further comprises a third driving element used for generating a third driving force to the movable portion. The third driving element is electrically connected to the first circuit. The third driving element is electrically connectable to the second circuit. The third circuit is electrically connectable to the second circuit through the third driving element. The third driving element is electrically connected to the control assembly through the first circuit. The third driving element is electrically connectable to the control assembly through the second circuit. The circuit assembly further comprises a fifth circuit electrically connected to the third driving element. The first circuit is electrically connectable to the second circuit through the fifth circuit. The fifth circuit is electrically connected to the signal adjusting assembly. The signal adjusting assembly is electrically connected to the first circuit or the second circuit through the fifth circuit. The material of the third driving element comprises shape memory alloy.

In some embodiments, the signal adjusting assembly comprises a first switch element electrically connected to the third circuit and used for controlling whether the first circuit is electrically connected to the second circuit by the third circuit. The first switch element comprises a first passing circuit electrically connected to the third circuit, and a first control circuit used for controlling whether the first passing circuit is in conduction. The first control circuit receives a first control signal provided by the control assembly. The first signal comprises first information at a first timing and a second information at a second timing, wherein the first timing and the second timing are at different times. The first switch element allows the first information to the first driving element based on the first control signal. The first switch element prevents the second information to the first driving element based on the first control signal.

In some embodiments, the signal adjusting assembly further comprises a second switch element used for controlling whether the first circuit is electrically connected to the second circuit by the fourth circuit. The second switch element comprises a second passing circuit electrically connected to the fourth circuit, and a second control circuit used for controlling whether the second passing circuit is in conduction. The second control circuit receives a second control signal provided by the control assembly. The second switch element prevents the first information to the second driving element based on the second control signal. The second switch element allows the second information to the second driving element based on the second control signal.

In some embodiments, the signal adjusting assembly further comprises a third switch element electrically connected to the fifth circuit and used for controlling whether the first circuit is electrically connected to the second circuit by the fifth circuit. The third switch element comprises a third passing circuit electrically connected to the fifth circuit, and a third control circuit used for controlling whether the third passing circuit is in conduction. The third control circuit receives a third control signal provided by the control assembly. The first signal comprises third information at a third timing, wherein the third timing, the first timing, and the second timing are at different times. The third switch element prevents the first information to the third driving element based on the third control signal. The first switch element prevents the second information to the third driving element based on the third control signal.

In some embodiments, the first switch element further comprises a second passing circuit electrically connected to the fourth circuit. The first control circuit is used for controlling whether the second passing circuit is in electrical connection. The first switch element allows or prevents the first information to the first driving element. The first switch element allows or prevents the second information to the second driving element.

In some embodiments, the first switch element further comprises a third passing circuit electrically connected to the fifth circuit. The first signal comprises third information at a third timing, wherein the third timing, the first timing, and the second timing are at different times. The first switch element allows the third information to the third driving element. The first switch element prevents the first information to the third driving element. The first switch element prevents the second information to the third driving element.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1A:
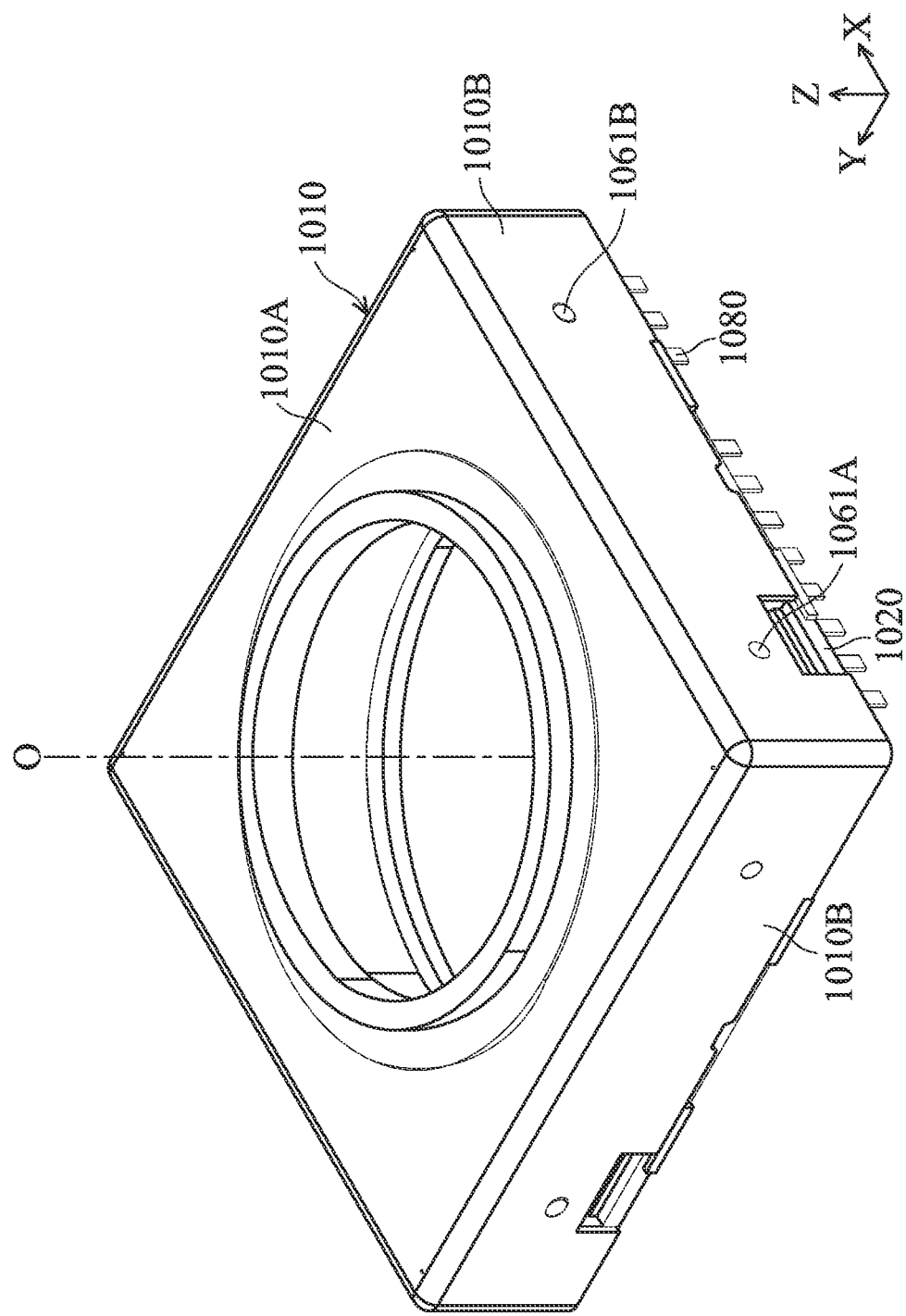
FIG. 1A is a schematic view of an optical element driving mechanism in some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, in some embodiments, the formation of a first feature over or on a second feature in the description that follows may include embodiments in which the first and second features are in direct contact, and may also include embodiments in which additional features may be disposed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are in direct contact, and may also include embodiments in which additional features may be disposed interposing the features, such that the features may not be in direct contact. In addition, spatially relative terms, for example, "vertical," "above," "over," "below,", "bottom," etc. as well as derivatives thereof (e.g., "downwardly," "upwardly," etc.) are used in the present disclosure for ease of description of one feature's relationship to another feature. The spatially relative terms are intended to cover different orientations of the device, including the features.

Unless defined otherwise, all technical and scientific terms used herein have the same meaning as commonly understood by one of ordinary skill in the art to which this disclosure belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

Use of ordinal terms such as "first", "second", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

In addition, in some embodiments of the present disclosure, terms concerning attachments, coupling and the like, such as "connected" and "interconnected", refer to a relationship wherein structures are secured or attached to one another either directly or indirectly through intervening structures, as well as both movable or rigid attachments or relationships, unless expressly described otherwise.

Figure 1B:
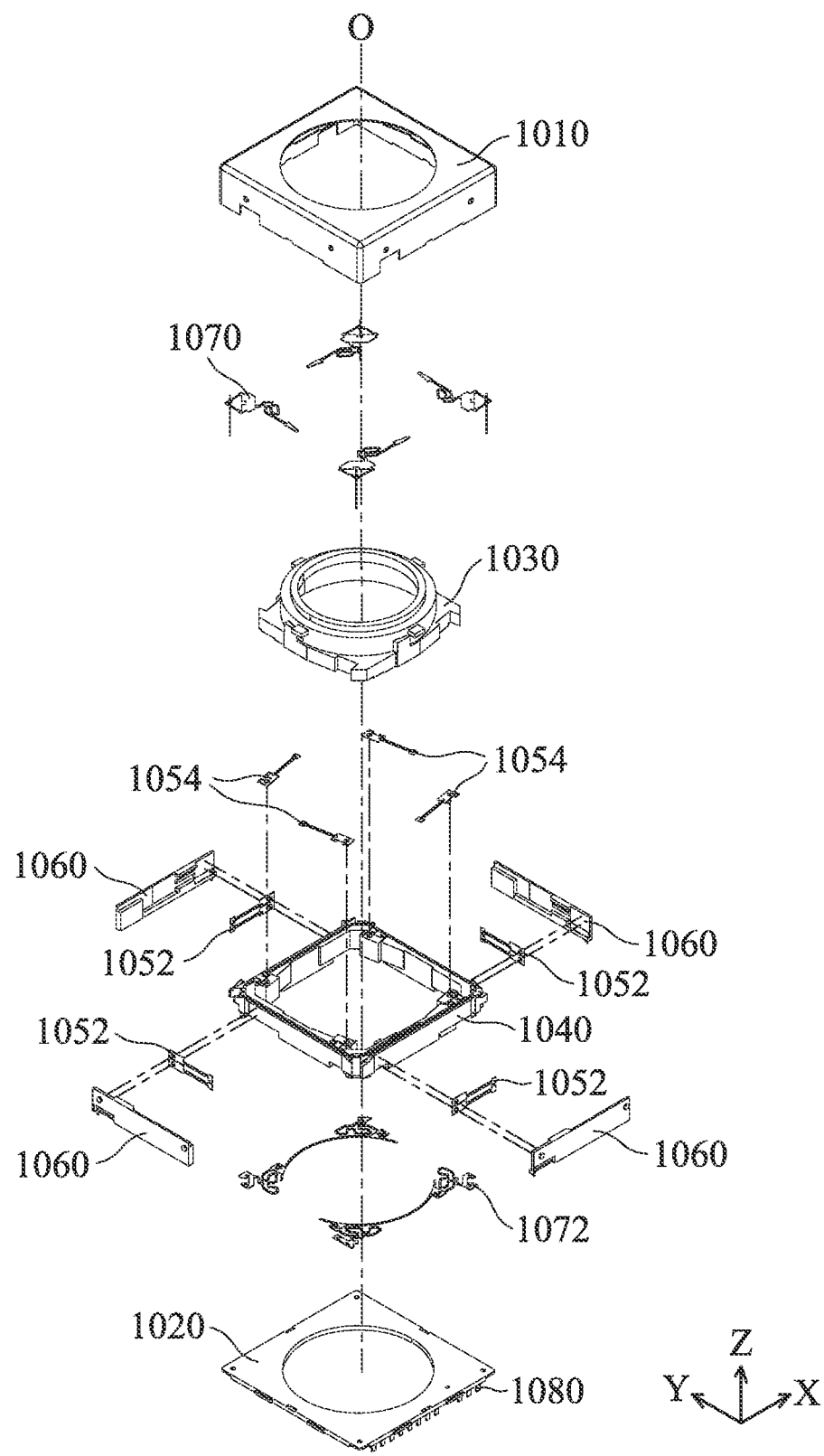
FIG. 1B is an exploded view of the optical element driving mechanism.
Figure 1C:
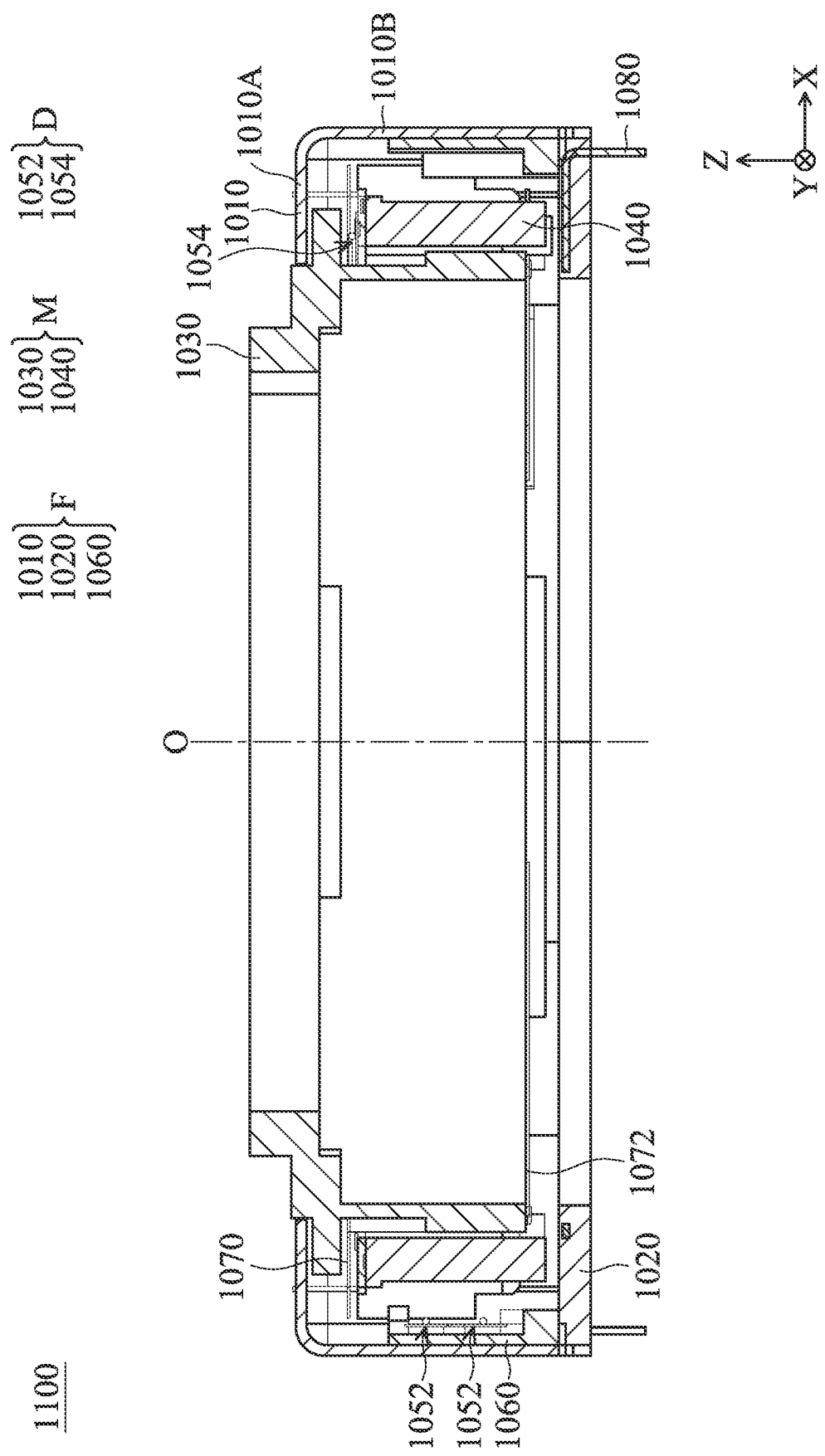
FIG. 1C is a cross-sectional view of the optical element driving mechanism.
Figure 1D:
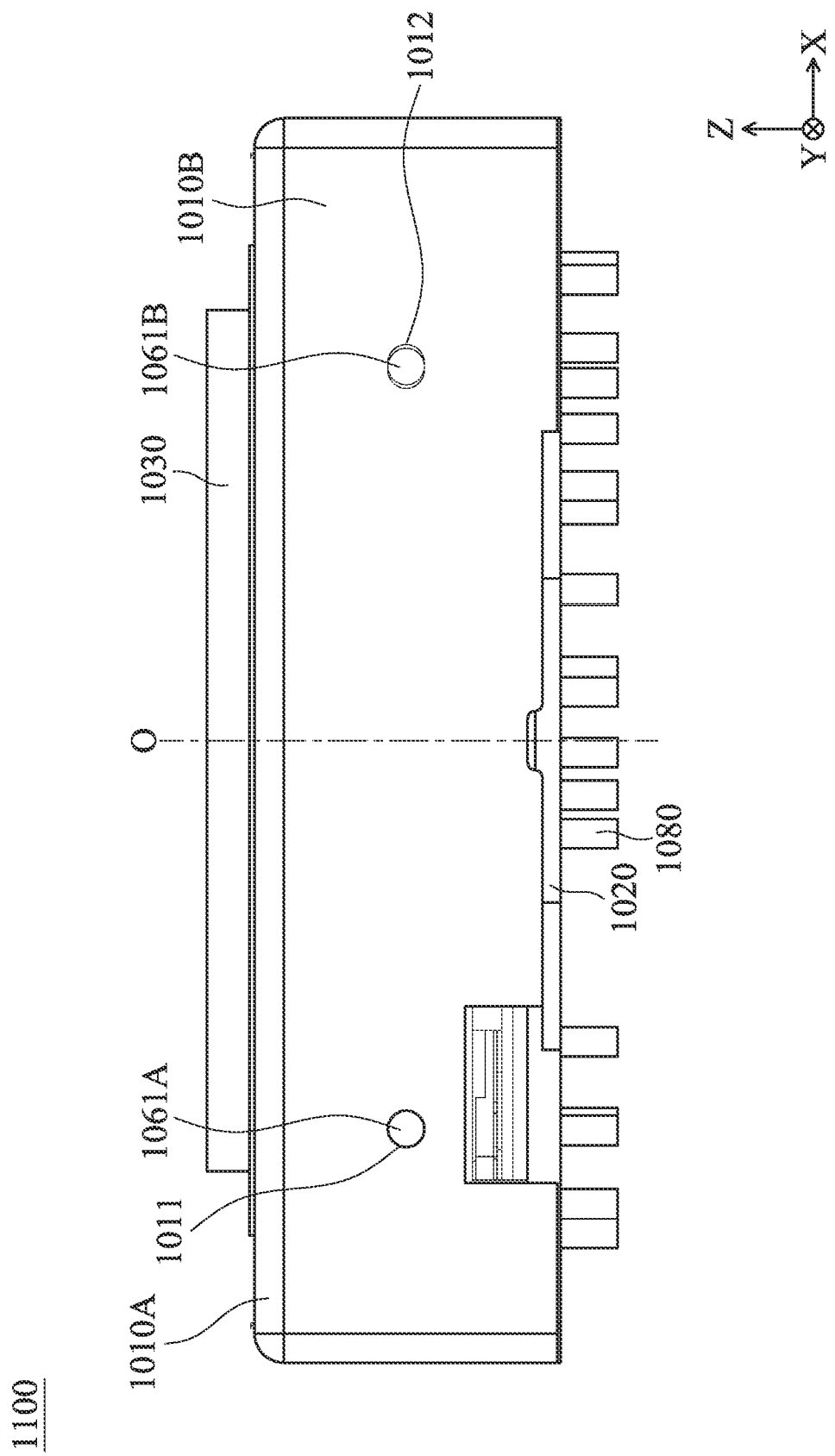
FIG. 1D is a side view of the optical element driving mechanism.
Figure 1E:
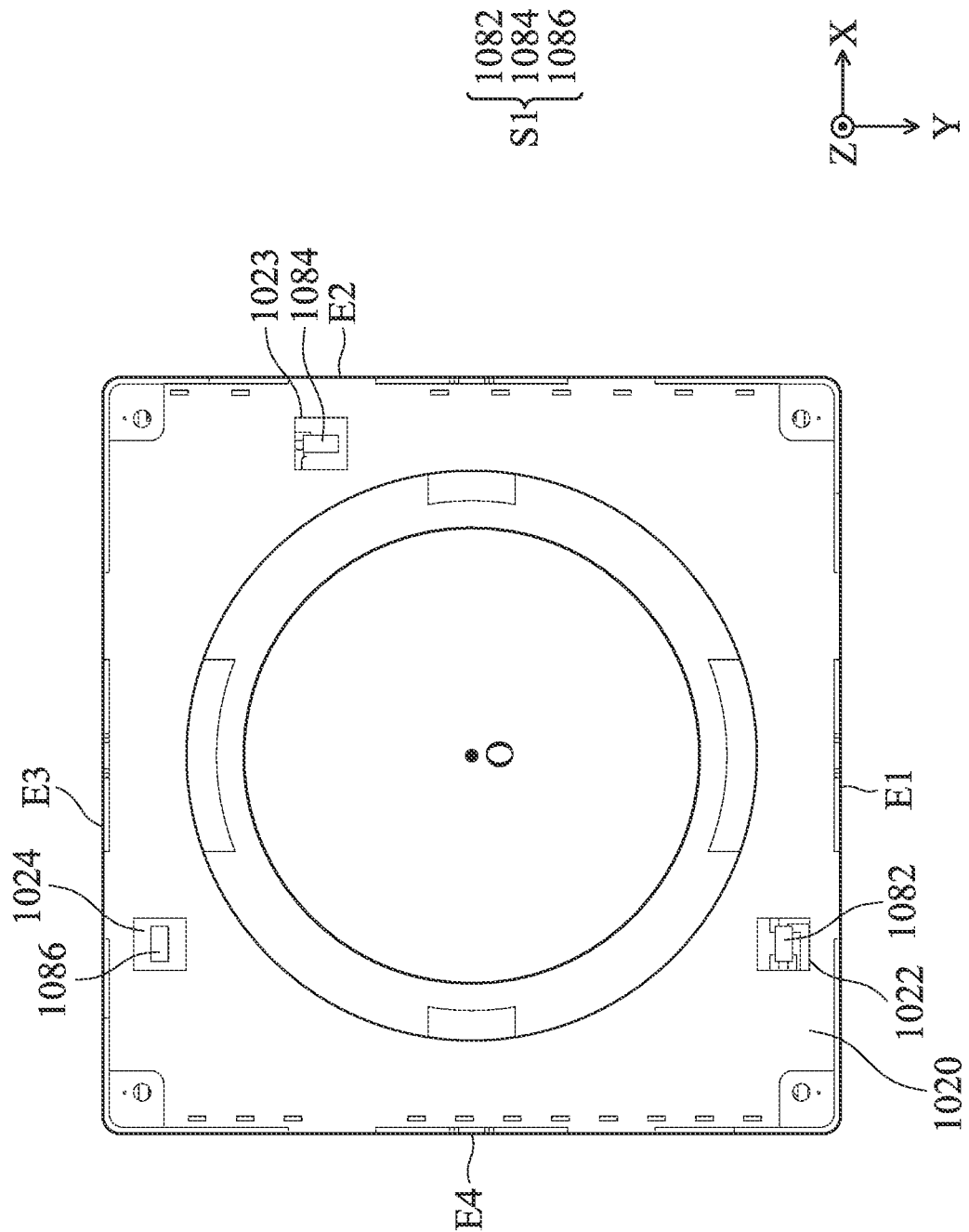
FIG. 1E is a bottom view of the optical element driving mechanism.

Refer to FIG. 1A to FIG. 1E. FIG. 1A is a schematic view of an optical element driving mechanism 1100 in some embodiments of the present disclosure. FIG. 1B is an exploded view of the optical element driving mechanism 1100. FIG. 1C is a cross-sectional view of the optical element driving mechanism 1100. FIG. 1D is a side view of the optical element driving mechanism 1100. FIG. 1E is a bottom view of the optical element driving mechanism 1100.

As shown in FIG. 1B, the optical element driving mechanism 1100 may mainly include a case 1010, a bottom 1020, a holder 1030, a frame 1040, a driving element 1052, a driving element 1054, a base unit 1060, a first resilient element 1070, a second resilient element 1072. The case 1010, the bottom 1020, and the base unit 1060 may be called as a fixed portion F. The holder 1030 and the frame 1040 may be called as a movable portion M. The driving elements 1052 and 1054 may be called as a driving assembly D.

The movable portion M may use for holding an optical element (not shown) and is movable relative to the fixed portion F. The optical element may be a lens, a mirror, a prism, a beam splitter, an aperture, a camera module, or a depth sensor. Furthermore, the driving assembly D may drive the movable portion M to move relative to the fixed portion F. Therefore, the optical element may be driven by the optical element driving mechanism 1100 to move in different directions, thereby achieving auto focus (AF) or optical image stabilization (OIS).

The case 1010 and the bottom 1020 may be combined to form a shell of the optical element driving mechanism 1100. For example, the bottom 1020 may be affixed on the case 1010. It should be noted that a case opening and a bottom opening are formed on the case 1010 and the bottom 1020, respectively. The center of the case opening corresponds to an optical axis of the optical element. The base opening corresponds to an image sensor (not shown) disposed outside the optical element driving mechanism 1100. Therefore, the optical element disposed in the optical element driving mechanism 1100 may perform focus to the image sensor along the optical axis. Furthermore, when viewed along the main axis O, the fixed portion F has a polygonal structure.

The holder 1030 has a through hole, and the optical element may be affixed in the through hole. The driving elements 1052 are disposed between the frame 1040 and the base unit 1060, such as disposed on the base unit 1060. The driving elements 1054 are disposed between the holder 1030 and the frame 1040, such as disposed on the frame 1040. However, the present disclosure is not limited thereto. For example, the driving element 1054 may be disposed on the frame 1040, or the driving element 1054 may be disposed on the holder 1030, depending on design requirement.

In this embodiment, the holder 1060 and the optical element disposed therein are movably disposed in the frame 1040. More specifically, the holder 1060 may be connected to and suspended in the frame 1040 by the first resilient element 1070 and the second resilient element 1072 made of a metal material, for example. When current is applied to the driving element 1052, the driving element 1052 will move the holder 1030, the frame 1040, and the optical element to move relative to the fixed portion F in different directions to achieve optical image stabilization. When current is applied to the driving element 1054, the driving element 1054 will drive the holder 1030 to move relative to the frame 1040 along the main axis O to achieve auto focus.

In some embodiments, additional circuits 1080 may be provided on the bottom 1020 and electrically connects to electronic elements disposed inside or outside the driving mechanism 1100 for achieve auto focus or optical image stabilization. In some embodiments, the circuit 1080 may be disposed on an additional main body (such as a circuit board, not shown). The main body may be plate-shaped to accommodate the circuit 1080.

The circuits 1080 on the bottom 1020 may transfer electrical signal to the driving elements 1052, 1054 through the first resilient element 1070 or the second resilient element 1072 to control the movement of the movable portion M in X, Y, or Z directions.

The second resilient element 1072 may be assembled with the circuits on the bottom 1020 by soldering or laser welding to allow the driving elements 1052 and 1054 connecting to external circuits.

In some embodiments, the case 1010 may include a top plate 1010A and sidewalls 1010B extending from the sides of the top plate 1010A in the Z direction to the bottom 1020. The base unit 1060 may be affixed on the sidewall 1010B, such as by an adhesive element (not shown). As shown in FIG. 1D, the sidewall 1010B may include a first position structure 1011 and a second position structure 1012, which correspond to a third position structure 1061A and a fourth position structure 1061B of the base unit 1060, respectively. For example, the first position structure 1011 and the second position structure 1012 may be openings, and the third position structure 1061A and the fourth position structure 1061B may protrude from the base unit 1060 and in the first position structure 1011 and the second position structure 1012, respectively.

In some embodiments, the length of the first position structure 1011 and the length of the second position structure 1012 in the X direction are different. Therefore, a maximum gap between the first position structure 1011 and the third position structure 1061A is different from a maximum gap between the second position structure 1012 and the fourth position structure 1061B. For example, the length of the first position structure 1011 in the X direction may be less than the length of the second position structure 1012 in the X direction. Therefore, the maximum gap between the first position structure 1011 and the third position structure 1061A is greater than the maximum gap between the second position structure 1012 and the fourth position structure 1061B. In some embodiments, the adhesive element may be disposed in the first position structure 1011 and the second position structure 1012, and in direct contact with the third position structure 1061A and the fourth position structure 1061B. Therefore, the relative position of the case 1010 and the base unit 1060 may be affixed. In some embodiments, the adhesive element may be glue.

In some embodiments, as shown in FIG. 1E, a first position sensor 1082, a second position sensor 1084, and a third position sensor 1086 may be disposed in the optical element driving mechanism 1100, and corresponding magnetic elements (not shown) may be disposed on the movable portion M. For example, the bottom 1020 may have openings 1022, 1023, 1024, and the first position sensor 1082, the second position sensor 1084, and the third position sensor 1086 may be disposed in the openings 1022, 1023, 1024, respectively. Therefore, the movement of the movable portion M relative to the fixed portion F in different dimensions may be detected. For example, the movement of the frame 1040 relative to the fixed portion F may be detected. In some embodiments, the first position sensor 1082, the second position sensor 1084, and the third position sensor 1086 may be called as a first position sensing assembly S1.

The first position sensor 1082, the second position sensor 1084, and the third position sensor 1086 may include a Hall sensor, a magnetoresistance effect sensor (MR sensor), a giant magnetoresistance effect sensor (GMR sensor), a tunneling magnetoresistance effect sensor (TMR sensor), or a fluxgate sensor.

In some embodiments, the first position sensor 1082 may be used to detect the movement of the frame 1040 relative to the fixed portion F in a first dimension, the second position sensor 1084 may be used to detect the movement of the frame 1040 relative to the fixed portion F in a second dimension, the third position sensor 1086 may be used to detect the movement of the frame 1040 relative to the fixed portion F in a third dimension. In some embodiments, the movement in the first dimension may be a movement in an eighth direction (e.g. X direction), the movement in the second dimension may be a movement in a ninth direction (e.g. Y direction), the movement in the third dimension may be a movement in a tenth direction (e.g. Y direction). In some embodiments, the eighth direction may be not parallel to the ninth direction or the tenth direction, and the ninth direction may be parallel to the tenth direction.

Moreover, the first position sensing assembly S1 may be used for detecting the movement of the movable portion M relative to the fixed portion F. For example, the movement in the fourth dimension may be a rotation relative to an axis extending in a eleventh direction (the extending direction of the main axis O). In other words, the movement in the fourth dimension may be the rotation where the rotational axis is the main axis O. It should be noted that the eleventh direction (e.g. the Z direction) may be not parallel to the eighth direction (e.g. the X direction). For example, the eleventh direction may be perpendicular to the eighth direction. The eleventh direction may be not parallel to the ninth direction (e.g. the Y direction). For example, the eleventh direction may be perpendicular to the ninth direction. The eleventh direction may be not parallel to the tenth direction (e.g. the Y direction). For example, the eleventh direction may be perpendicular to the tenth direction.

As shown in FIG. 1E, when viewed along the main axis O, the fixed portion has a first edge E1, a second edge E2, a third edge E3, and a fourth edge E4. The first position sensor 1082 is at the first edge E1, the second position sensor 1084 is at the second edge E2, and the third position sensor 1086 may at the first edge E1 or the third edge E3. For example, the third position 1086 may be disposed at the third edge E3 in FIG. 1E, but it is not limited thereto. In other embodiments, the third position sensor 1086 may be disposed at the first side E1. The movement of the movable portion M relative to the fixed portion F in the fourth dimension may be detected by the first position sensor 1082, the second position sensor 1084, and the third position sensor 1086. In some embodiments, the movement of the movement of the movable portion M relative to the fixed portion F in the first dimension may be detected by the first position sensor 1082 and the second position sensor 1084 of the first position sensing assembly S1 to achieve more accurate result.

Figure 2A:
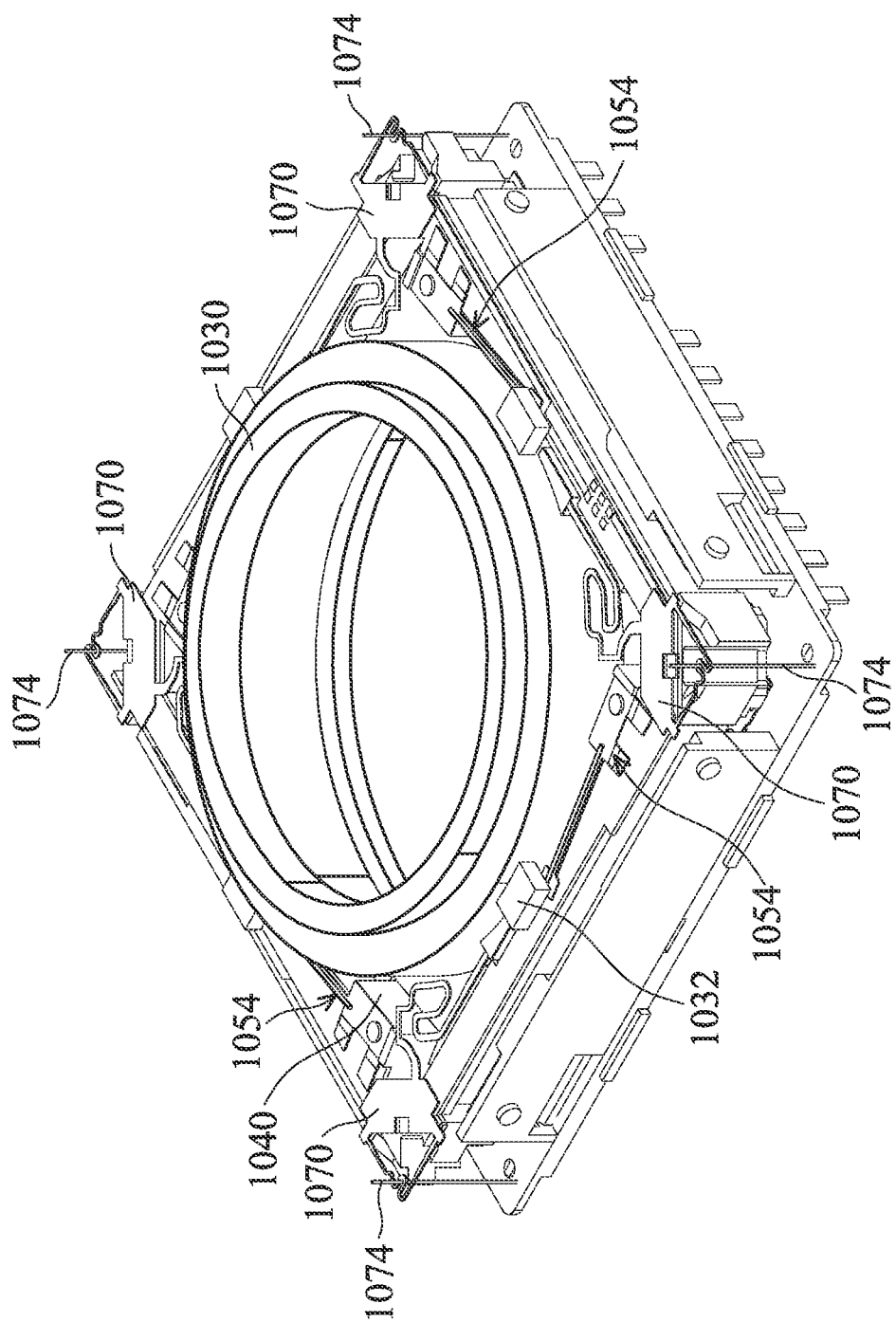
FIG. 2A is a schematic view of the optical element driving mechanism, wherein the case is omitted.
Figure 2B:
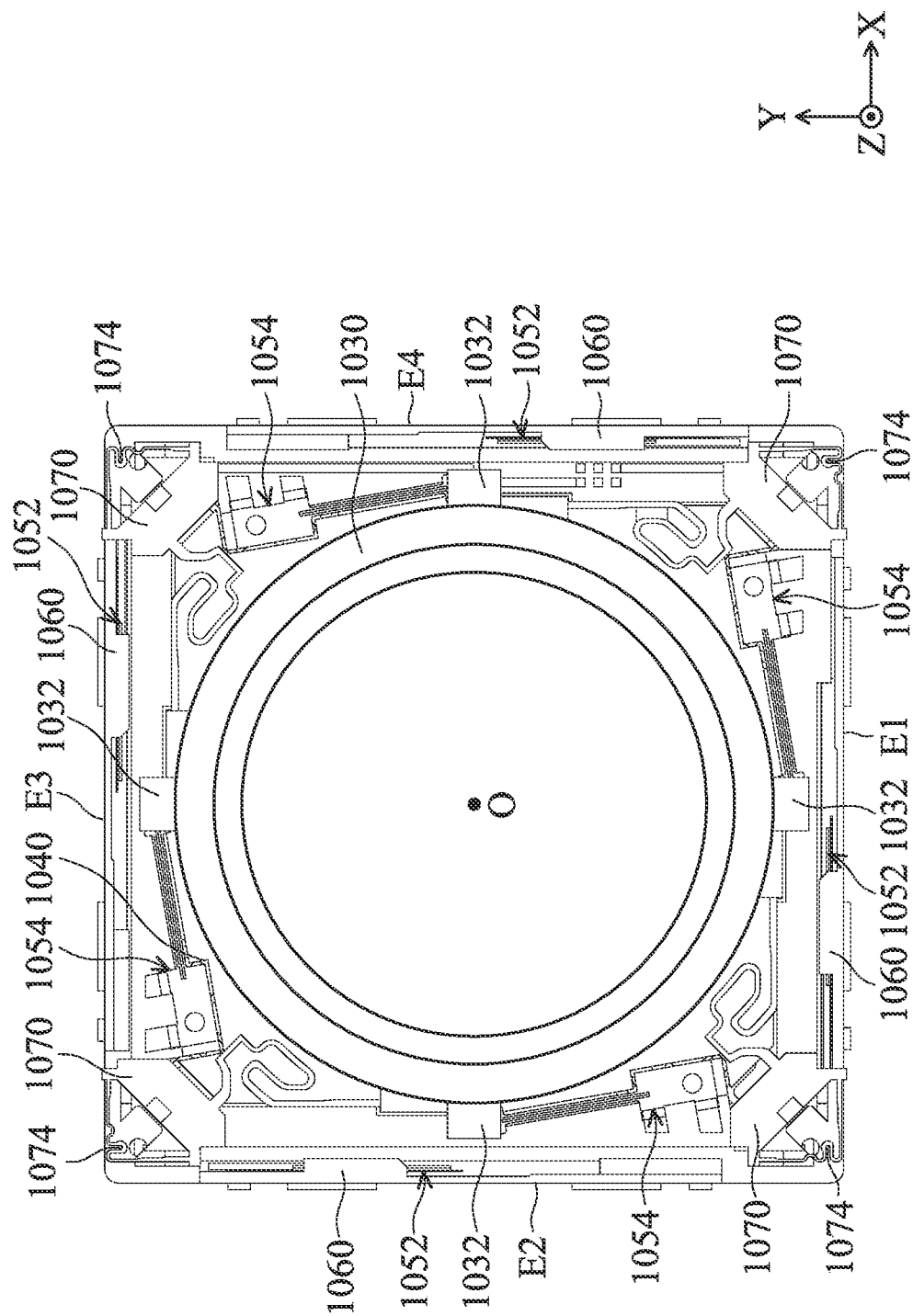
FIG. 2B is a top view of FIG. 2A.
Figure 2C:
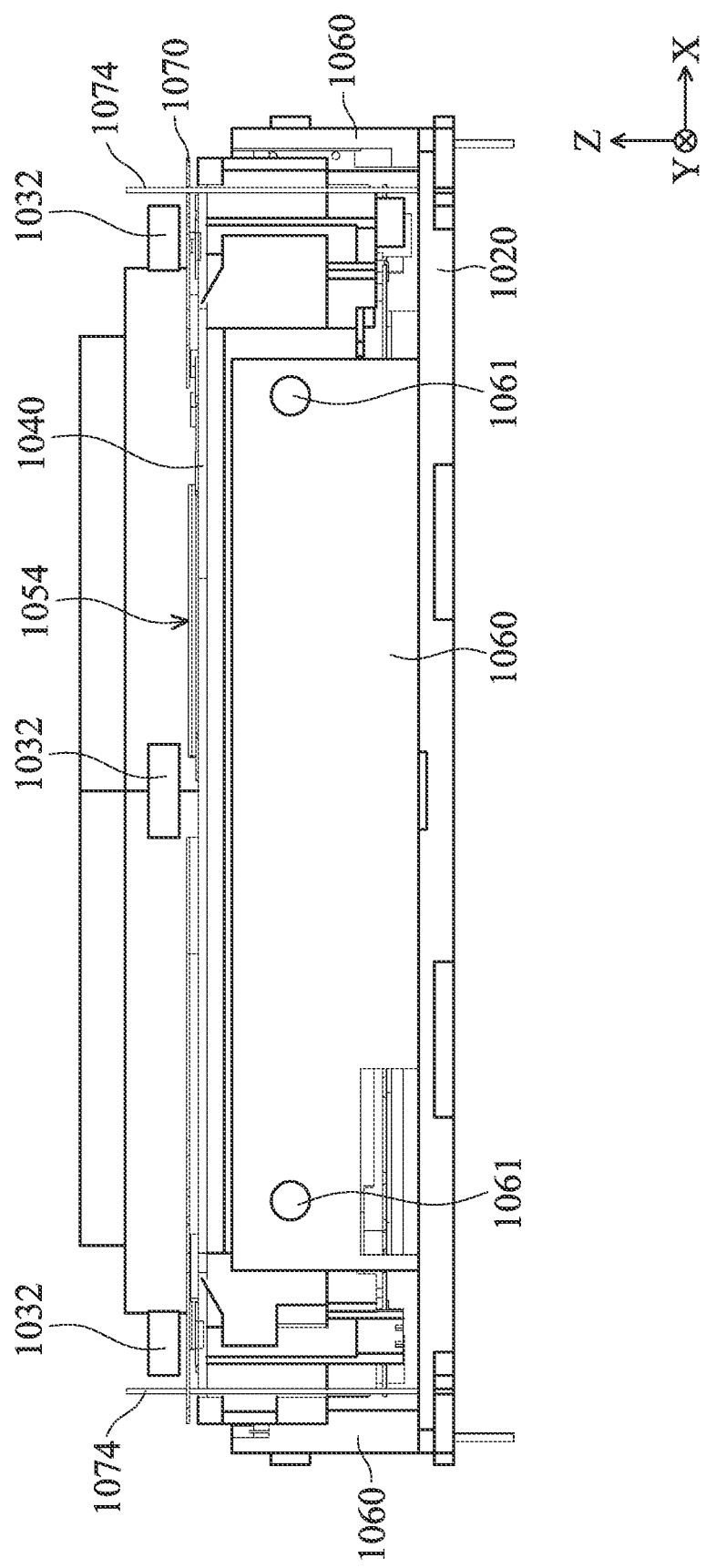
FIG. 2C is a side view of FIG. 2A.
Figure 2D:
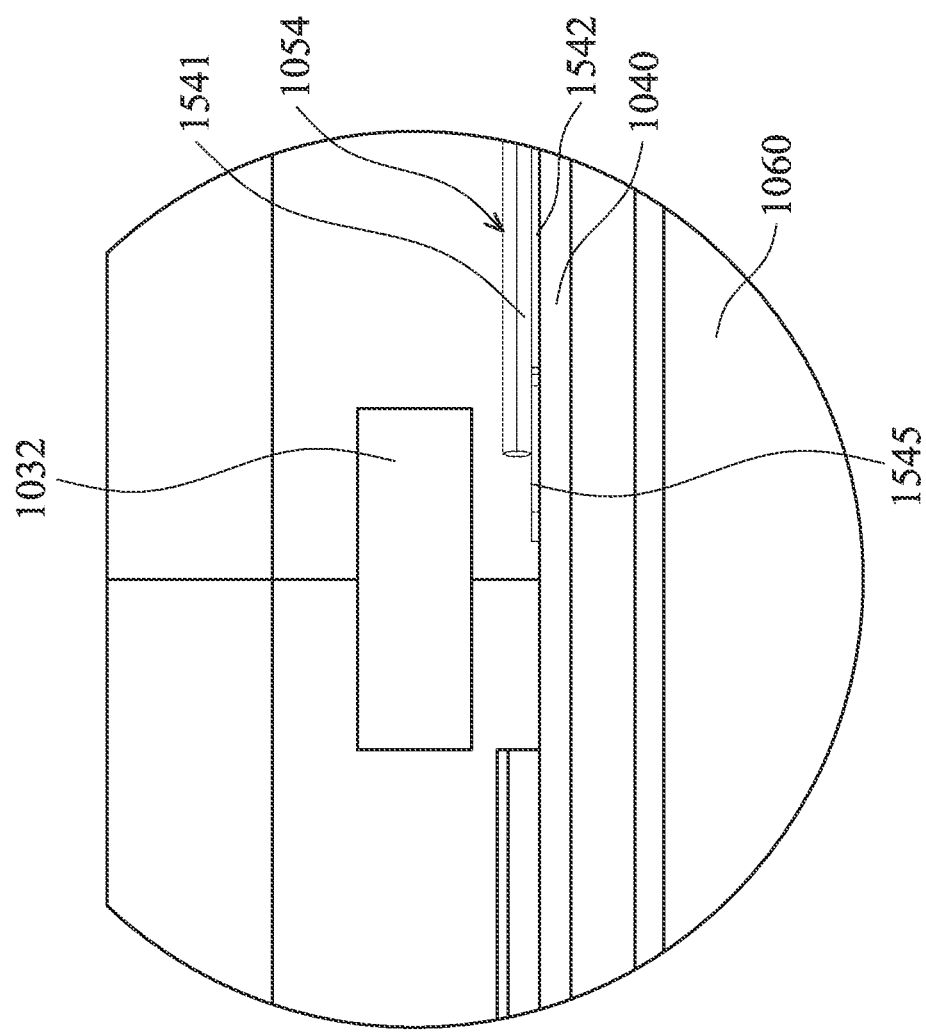
FIG. 2D is an enlarged view of FIG. 2C.

FIG. 2A is a schematic view of the optical element driving mechanism 1100, wherein the case 1010 is omitted. FIG. 2B is a top view of FIG. 2A. FIG. 2C is a side view of FIG. 2A. FIG. 2D is an enlarged view of FIG. 2C. The optical element driving mechanism 1100 may further include third resilient elements 1074 at the corners of the optical element driving mechanism 1100. The third resilient elements 1074 are used for movably connect the frame 1040 and the fixed portion F, so the frame 1040 and the movable portion 1030 disposed in the frame 1040 may be suspended in the fixed portion F. Moreover, the third resilient element 1074 may in direct contact with the first resilient element 1070 and the circuit 1080 to allow the driving element 1054 electrically connected to external environment through the first resilient element 1070, the third resilient element 1074, and the circuit 1080.

As shown in FIG. 2B, when viewed along the main axis O, the fixed portion F is polygonal, and the third resilient element 1074 may at the corners of the fixed portion F and electrically connected to the circuit disposed in the bottom 1020, and electrically connected to the first resilient element 1070. Moreover, the first resilient element 1070 may be plate-shaped, the third resilient element 1074 may be linear-shaped, and the extension direction of the third resilient element 1074 (the Z direction) may be parallel to the thickness direction of the first resilient element 1070 (the Z direction).

Furthermore, the holder 1030 may have extending portions 1032 that extends from the radial external surface of the holder 1030 along a direction that is perpendicular to the main axis O. Moreover, as shown in FIG. 2B to FIG. 2D, the extending portion 1032 at least overlaps a portion of the driving element 1054 in a direction that the main axis O extends. For example, the extending portion 1032 and the contact unit 1545 may arranged in the direction that the main axis O extends. Therefore, the extending portion 1032 may be pushed by the driving element 1054 to allow the holder 1030 moving in the direction that the main axis O extends to achieve auto focus. How the extending portion 1032 is pushed by the driving element 1054 will be described later. Moreover, in the direction that the main axis O extends, the driving element 1054 may be not overlap the first resilient element 1070 to reduce the size of the optical element driving mechanism 1100 in the Z direction, so miniaturization may be achieved.

Figure 2E:
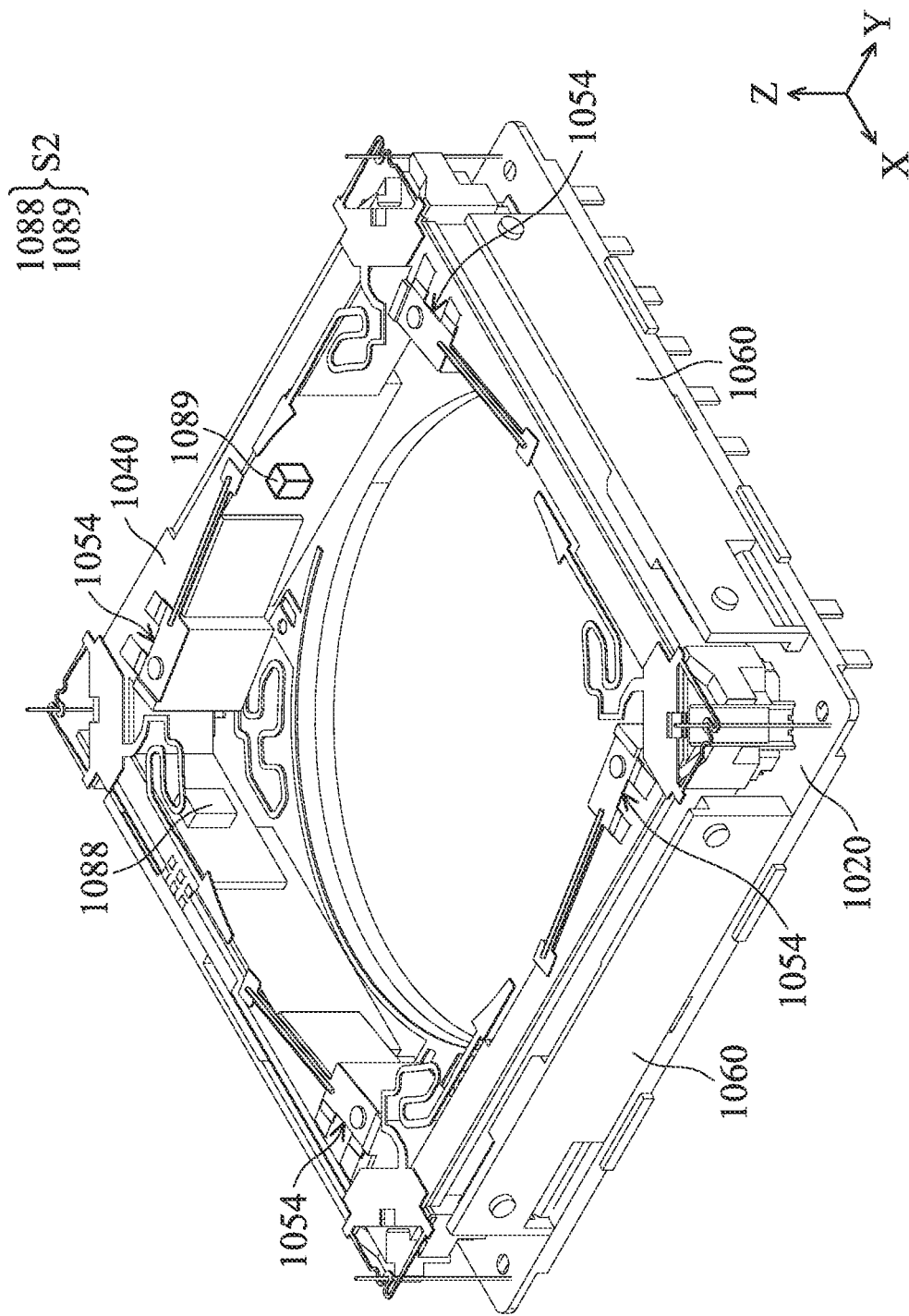
FIG. 2E is a schematic view of the elements in FIG. 2A, wherein the holder is omitted.

FIG. 2E is a schematic view of the elements in FIG. 2A, wherein the holder 1030 is omitted. As shown in FIG. 2E, the optical element driving mechanism 1100 may further includes a second position sensing assembly S2. The second position sensing assembly S2 may include a fourth position sensor 1088 and a fifth position sensor 1089 disposed on the frame 1040, and corresponding magnetic elements (not shown) disposed on the holder 1030. Therefore, when the holder 1030 moves relative to the frame 1040, the fourth position sensor 1088 and the fifth position sensor 1089 may detect the magnetic field variation of the magnetic element disposed on the holder 1030 when the holder 1030 is moving, so the movement of the holder 1030 relative to the frame 1040 may be detected.

In other words, the second position sensing assembly S2 may be used for detecting the movement of the holder 1030 relative to the frame 1040. For example, the second position sensing assembly S2 may be used for detecting the movement of the holder 1030 relative to the frame 1040 in a fifth dimension. It should be noted that the movement of the fifth dimension may be the movement in a twelfth direction (e.g. the Z direction). The twelfth direction may be not parallel to the eighth direction (e.g. the X direction), or the twelfth direction may be perpendicular to the eighth direction. The twelfth direction may be not parallel to the ninth direction (e.g. the Y direction), or the twelfth direction may be perpendicular to the ninth direction. The twelfth direction may be not parallel to the tenth direction (e.g. the Y direction), or the twelfth direction may be perpendicular to the tenth direction. The twelfth direction may be parallel to the eleventh direction (e.g. the Z direction). Moreover, as shown in FIG. 2E, at least a portion of the first resilient element 1070 is affixed on the base unit 1060.

Figure 2F:
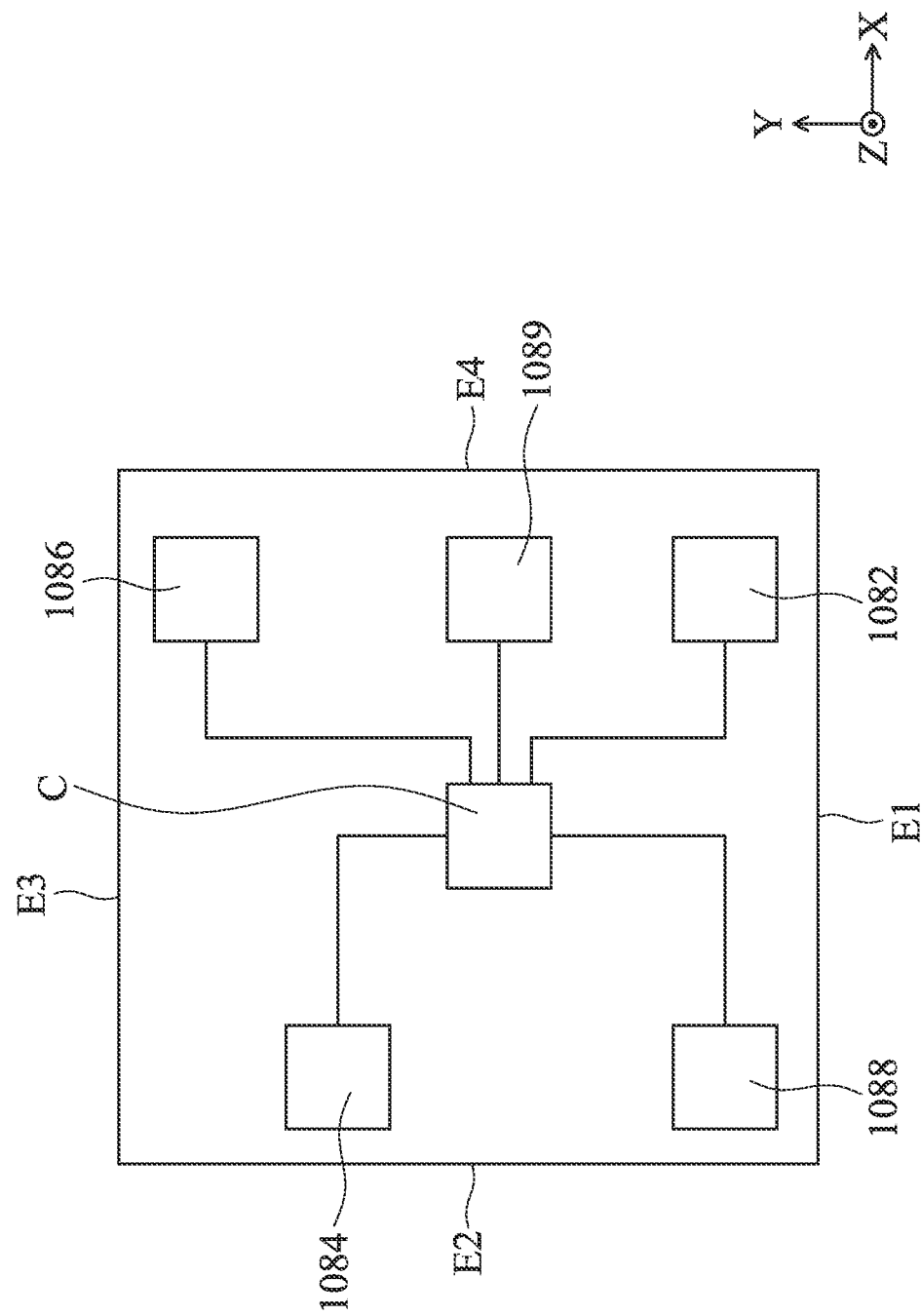
FIG. 2F is a schematic view of a first position sensor, a second position sensor, a third position sensor, and a fourth position sensor in the optical element driving mechanism.

FIG. 2F is a schematic view of the first position sensor 1082, the second position sensor 1084, the third position sensor 1086, the fourth position sensor 1088, and the fifth position sensor 1089. When viewed in the direction that the main axis O extends, as shown in FIG. 2F, the fourth position sensor 1088 of the second position sensing assembly S2 is at a corner of the fixed portion F, wherein the corner is formed by the first edge E1 and the second edge E2. Moreover, when viewed in the direction that the main axis O extends, the second position sensing assembly S2 (the fourth position sensor 1088 and the fifth position sensor 1089) does not overlap the first position sensing assembly S1 (the first position sensor 1082, the second position sensor 1084, and the third position sensor 1086). Therefore, magnetic interference between the position sensors and their corresponding magnetic elements may be prevented, so the accuracy may be enhanced.

Figure 3A:
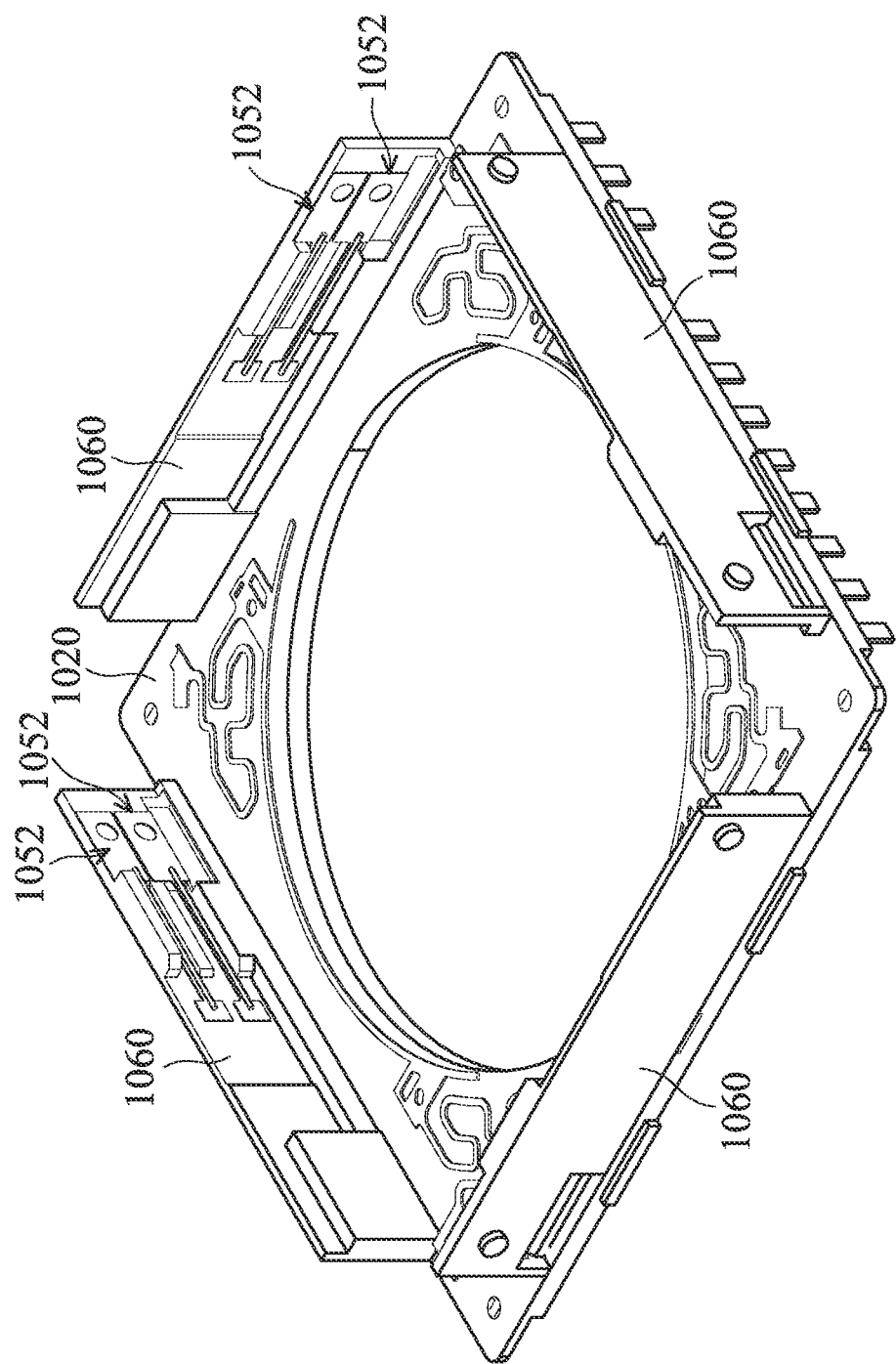
FIG. 3A is a schematic view of some elements of the optical element driving mechanism.
Figure 3B:
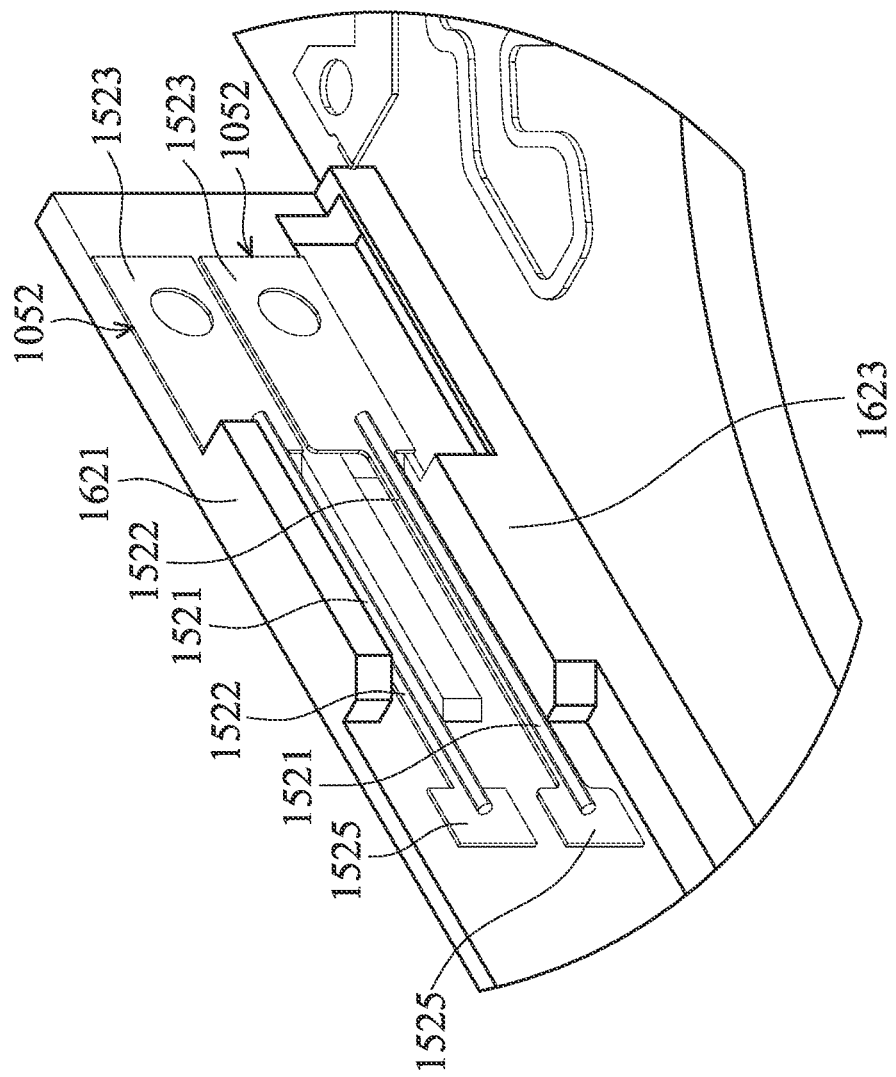
FIG. 3B is an enlarged view of FIG. 3A.
Figure 3C:
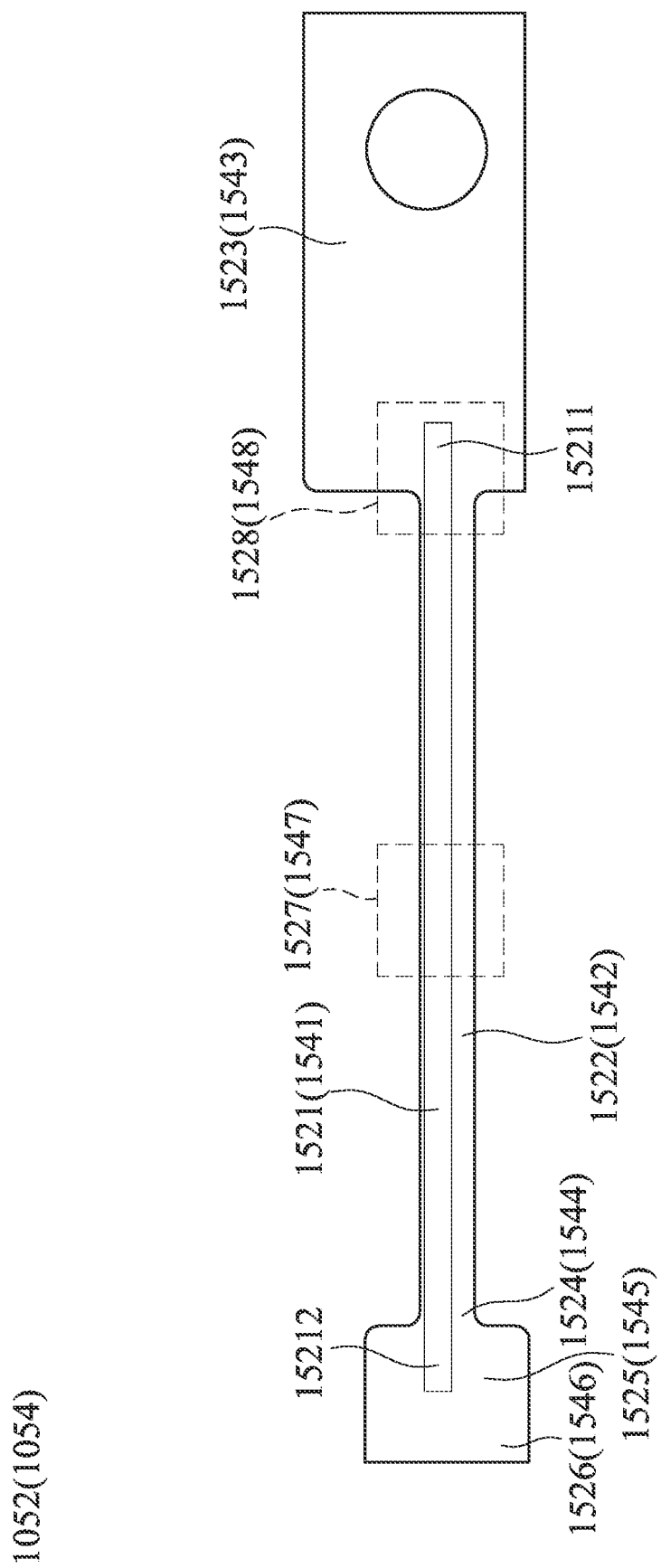
FIG. 3C is a schematic view of a driving element.

FIG. 3A is a schematic view of some elements in the optical element driving mechanism 1100, FIG. 3B is an enlarged view of FIG. 3A, and FIG. 3C is a schematic view of the driving element 1052 or 1054. In some embodiments, as shown in FIG. 3A and FIG. 3B, the optical element driving mechanism 1100 may have the driving element 1052 on one of the base units 1060, and more than one driving elements 1052 may be disposed on the base unit 1060 to movement in different direction. For example, the base unit 1060 may have stopping portions 1621 and 1623 (the stopping elements of the stopping assembly) protruding to the frame 1040 and extending in an extending direction of the driving element 1052. The driving element 1052 may be disposed between the stopping portions 1621 and 1623. In other words, the driving element 1052 is surrounded by the stopping portions 1621 and 1623 to prevent the driving element 1052 from being collided.

It should be noted that the stopping portions 1621 and 1623 (stopping assembly) are affixed on the base unit 1060, the base unit 1060 may be plate-shaped, and the material of the base unit 1060 may include plastic. When viewed in the thickness direction of the base unit 1060, the base unit 1060 may be polygonal (e.g. rectangular), and the stopping portions 1621 and 1623 may be position at different edges of the base unit 1060.

As shown in FIG. 3C, the driving element 1052 may include a driving unit 1521, a resilient unit 1522, a connecting unit 1523, a buffer unit 1524, a contact unit 1525, a contact portion 1526, and vibration preventing units 1527 and 1528. The driving element 1054 may include a driving unit 1541, a resilient element 1542, a connecting unit 1543, a buffer unit 1544, a contact unit 1545, a contact portion 1546, and vibration preventing units 1547 and 1548.

In some embodiments, the material of the driving unit 1521 may include shape memory alloy (SMA). The driving unit 1521 may be strip-shaped and extend in a direction. Shape memory alloy is an alloy material that can eliminate a deformation at a lower temperature and restore its original shape before deformation after heating. For example, when the shape memory alloy is subjected to a limited plastic deformation at a temperature lower than the phase transition temperature, the shape of the shape memory alloy may be restored to the original shape by heating.

In some embodiments, when a signal (e.g. voltage or current) is provided to the driving unit 1521, the temperature may be increased by the thermal effect of a current, so that the length of the driving unit 1521 may be decreased. On the contrary, if a signal having a lower intensity is provided which makes the heating rate lower than the heat dissipation rate of environment, the temperature of the driving unit 1521 may be decreased, and the length may be increased.

The driving unit 1521 may have an end 15211 affixed on the connecting unit 1523 and an end 15212 affixed on the contact unit 1525, and the resilient unit 1522 is resilient, such as may include metal. Therefore, when the driving unit 1521 is shrinking, the resilient unit 1522 may be bent by the driving unit 1521. Moreover, the driving unit 1521 and the resilient unit 1522 may include metal, so the driving unit 1521 may be electrically connected to the resilient unit 1522, and the heat generated by the driving unit 1521 may be dissipated by the resilient unit 1522. The connecting unit 1523 may be affixed on the fixed portion F, such as affixed on the base unit 1060, and the driving element 1052 may be electrically connected to external environment by the connecting unit 1523. It should be noted that as shown in FIG. 3B, in the direction that the main axis O extends (FIG. 2B) and in a first direction that the driving unit 1521 extends, the driving unit 1521 of the driving element 1052 at least overlaps a portion of the stopping portions 1621 and 1623.

The contact unit 1525 may be movably connected to the resilient unit 1521 through the buffer unit 1524. For example, the buffer unit 1524 may be a connection point of the resilient unit 1522 and the contact unit 1525, and the buffer unit 1524 may be bent. The resilient unit 1522 may be strip-shaped, and the contact unit 1525 may be rectangular or arc-shaped. However, the present disclosure is not limited thereto, and the units may have different directions. The contact unit 1525 may be used for in contact with the movable portion M (e.g. the frame 1040) or the fixed portion F (e.g. the base unit 1060). When the shape of the driving unit 1521 is changing (e.g. shrinking), the shape of the resilient unit 1522 may be changed accordingly (e.g. bending), so the contact unit 1525 will be moved. In some embodiments, the material of the contact unit 1525 may include metal, such as the resilient unit 1522, the buffer unit 1524, and the contact unit 1525 may be formed as one piece, i.e. having an identical material.

In some embodiments, the contact unit 1525 further includes a contact portion 1526 at an end of the contact unit 1525 that is away from the resilient unit 1522. Although the contact portion 1526 is illustrated as one piece, the present disclosure is not limited thereto. For example, in some embodiments, the contact 1525 may include a plurality of contact portions 1526, and the contact portions 1526 may be separated from each other, and connected to each other by the contact unit 1525. In other words, the contact unit 1525 and the plurality of contact portions 1526 may be formed as one piece.

In some embodiments, the vibration preventing unit 1527 may be disposed between the driving unit 1521 and the resilient unit 1522, such as disposed between the center of the driving unit 1521 and the center of the resilient unit 1522. The vibration preventing unit 1528 may be disposed on the end 15211 of the driving unit 1521, and the vibration preventing units 1527 and 1528 may be in direct contact with the driving unit 1521 and the resilient unit 1522 to absorb the vibration generated by the deformation of the driving unit 1521 and the resilient unit 1522, so the driving unit 1521 and the resilient unit 1522 may be prevented from being damaged.

In some embodiments, the material of the vibration preventing units 1527 or 1528 may include soft resin. In other words, the Young's modulus of the vibration preventing units 1527 or 1528 may be less than the Young's modulus of the base unit 1060.

The structures and functions of the driving unit 1541, the resilient unit 1542, the connecting unit 1543, the buffer unit 1544, the contact unit 1545, the contact portion 1546, the vibration preventing units 1547 and 1548 of the driving unit 1054 are respectively similar or identical to the structures and functions of the driving unit 1521, the resilient unit 1522, the connecting unit 1523, the buffer unit 1524, the contact unit 1525, the contact portion 1526, the vibration preventing units 1527 and 1528 of the driving unit 1024, and are not repeated again.

Figure 3D:
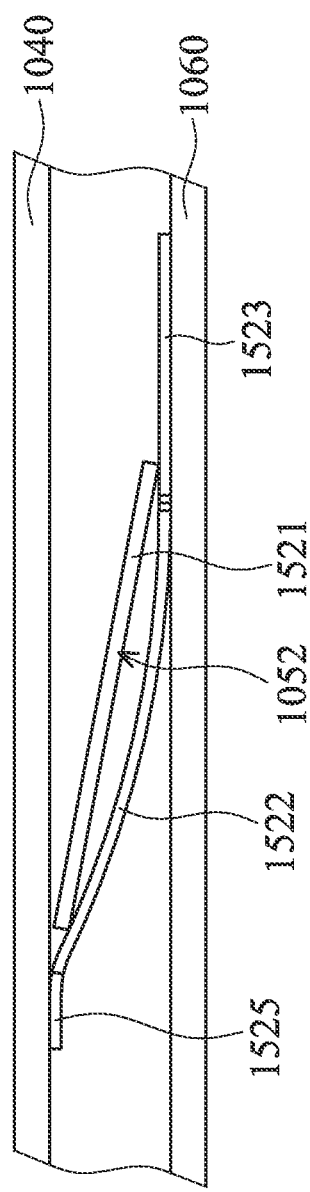
FIG. 3D is a schematic view when the frame is pushed by the driving element relative to a base unit.
Figure 3E:
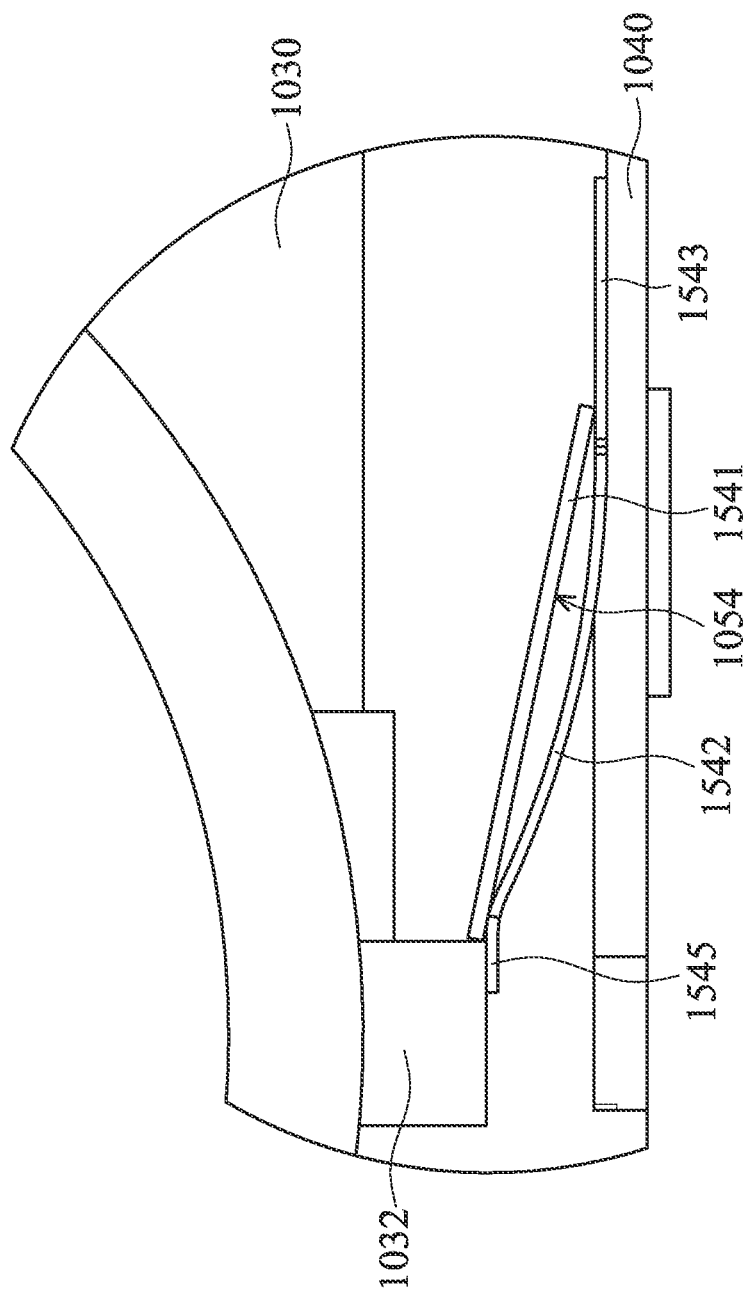
FIG. 3E is a schematic view when the holder is pushed by the driving element relative to the frame.

FIG. 3D is a schematic view when the frame 1040 is pushed by the driving element 1052 relative to a base unit 1060. FIG. 3E is a schematic view when the holder 1030 is pushed by the driving element 1054 relative to the frame 1040. As shown in FIG. 3D, when the driving unit 1521 of the driving element 1052 is shrinking, the resilient unit 1522 may be deformed accordingly. The connecting unit 1523 is affixed on the base unit 1060, so only the contact unit 1525 may be moved by the driving unit 1521, such as moves to the frame 1040. When the contact unit 1525 is moved to in contact with the frame 1040, a driving force may be applied to the frame 1040 by the contact unit 1525. The direction of the driving force (from the base unit 1060 to the frame 1040) is different from the extension direction of the driving unit 1521 when the driving unit 1521 is static. For example, if the driving unit 1521 extends in the X direction when static, the direction of the driving force may be the Y direction that is perpendicular to the X direction to allow the frame 1040 moving in the Y direction.

As shown in FIG. 3E, when the driving unit 1541 of the driving element 1054 is shrinking, the resilient unit 1542 may be deformed accordingly. The connecting unit 1543 is affixed on the frame 1040, so only the contact unit 1545 may be moved by the driving unit 1541, such as moves to the extending portion 1032 of the holder 1030. When the contact unit 1545 is moved to in contact with the extending portion 1032, a driving force may be applied to the holder 1030 by the contact unit 1545. The direction of the driving force (from the frame 1040 to the extending portion 1032) is different from the extension direction of the driving unit 1541 when the driving unit 1541 is static. For example, if the driving unit 1541 extends in a direction on the XY plane when static, the direction of the driving force may be the Z direction that is perpendicular to this direction to allow the holder 1030 moving in the Z direction.

Figure 3F:
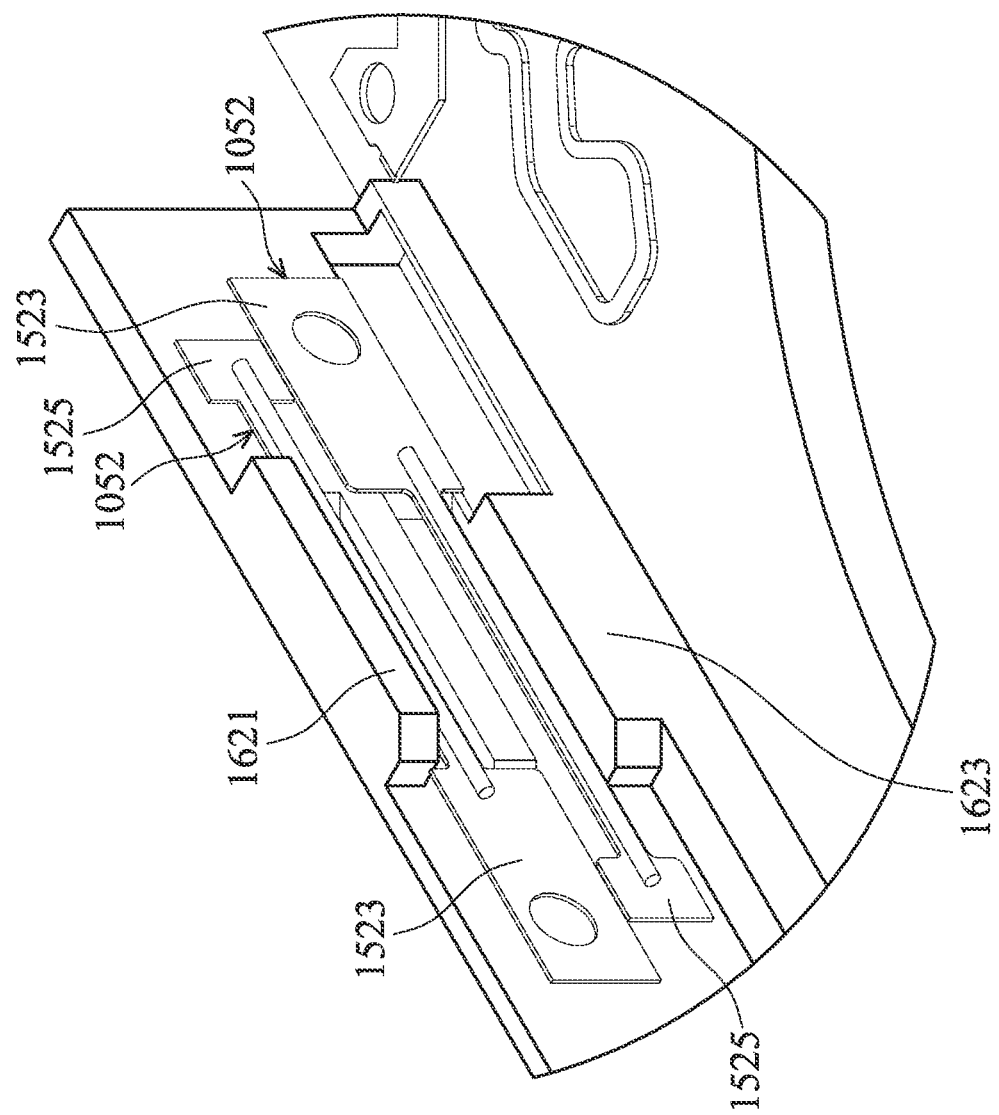
FIG. 3F is a schematic view of another configuration of the driving elements in other embodiments of the present disclosure.

Although the two driving elements 1052 extend in an identical direction, the present disclosure is not limited thereto. For example, FIG. 3F is schematic view of another configuration of the driving units 1052 in other embodiments of the present disclosure, wherein the two driving units 1052 extend in opposite directions. Therefore, the contact units 1525 of the two driving units 1052 may push the frame 1040 at different positions, so different torque may be provided to the frame 1040. Therefore, the frame 1040 may move and rotate at the same time.

Referring back to FIG. 3B. When the frame 1040 moves relative to the fixed portion F (e.g. the base unit 1060), because the stopping portions 1621 and 1623 protrude to the frame 1040, a limit range may be defined to determine a movable range of the frame 1040 by the stopping portions 1621 and 1623. For example, the limit range may have a first position and a second position. When the frame 1040 (the movable portion M) is at the first position relative to the base unit 1060 (the fixed portion F), the driving unit 1052 is not in contact with the frame 1040. When the frame 1040 is at the second position relative to the base unit 1060, the driving element 1052 may be in direct contact with the frame 1040 and the base unit 1060.

In some embodiments, the base unit 1060 may further include a recess 1624 corresponding to the contact unit 1525, such as overlap each other in a direction that the main axis O extends. Therefore, when the driving unit 1521 is not shrink, the shape of the resilient unit 1522 is back to the shape shown in FIG. 3B. The contact unit 1525 may be prevented from being in direct contact with the base unit 1060 by the recess 1624 when the resilient unit 1522 is deforming, so the contact unit 1525 may be protected. Moreover, the material of the recess 1624 does not include conductive material, such as does not include metal, so short may be prevented when the contact unit 1525 is in contact with the recess 1624.

It should be noted that in some embodiments, when the movable portion M is driven by the driving assembly D to move in the first dimension (the translational movement in X direction) relative to the fixed portion F, the movable portion M is also driven by the driving assembly D to move in a sixth dimension. The movement in the sixth dimension may be a rotation with the optical axis of the optical element as the rotational axis. It should be noted that the optical axis may be different from the main axis O. For example, when the driving assembly D drives the movable portion M to move in the first dimension relative to the fixed portion F, the optical element may be moved, so the optical axis may be moved relative to the main axis. Therefore, the movable portion M may be allowed to move in more dimensions relative to the fixed portion F, and the performance of optical image stabilization may be enhanced as well.

In some embodiments, when the movable portion M is driven by the driving assembly D and only moves in the first dimension relative to the fixed portion, the movable portion M is only movable in a first limit range of a maximum movable range in the first dimension. The first limit range is defined by the movable range of the frame 1040. For example, if the movable portion M moves in the X direction, the first limit range may be defined by the maximum movable range of the movable portion M in the X direction. Afterwards, when the movable portion M is driven by the driving assembly D to move relative to the fixed portion F in both of the first dimension and the sixth dimension, the movable portion M is only movable in a second limit range of the maximum movable range in the first dimension. It should be noted that in the first dimension, the first limit range is greater than the second limit range, and the maximum movable range is greater than the first limit range. In other words, if the movable portion M not only moves in the first dimension, but also moves in the sixth dimension, the movable range of the movable portion M in the first dimension will be decreased accordingly.

When the movable portion M moves relative to the fixed portion F in the first limit range, the stopping portions 1621 and 1623 (the stopping assembly) is not in contact with at least one of the movable portion M and the fixed portion F. In this embodiments, the stopping portions 1621 and 1623 are disposed on the fixed portion F, so the stopping portions 1621 and 1623 will not in direct contact with the movable portion M when the movable portion M is in the first limit range. However, the present disclosure is not limited thereto. For example, the stopping assembly may be disposed on the movable portion M. In such embodiments, when the movable portion M is in the first limit range, the stopping assembly on the movable portion M will not in direct contact with the fixed portion F, so the movable portion M and the fixed portion F may be prevented from being damaged by the collision between each other.

In some embodiments, when the movable portion M is driven by the driving assembly D to only move in the sixth dimension relative to the fixed portion F, the movable portion M is only allowed to move in a third limit range of the maximum movable range in the sixth dimension. When the movable portion M is driven by the driving assembly D to move in both of the first dimension and the sixth dimension relative to the fixed portion F, the movable portion M is only allowed to move in a fourth limit range of the maximum movable range in the sixth dimension. It should be noted that the third limit range is greater than the fourth limit range in the sixth dimension. In other words, if the movable portion M not only moves in the sixth dimension, but also moves in the first dimension, the movable range of the movable portion M in the sixth dimension will be decreased accordingly. Similarly, when the movable portion M moves relative to the fixed portion F in the third limit range, the stopping portions 1621 and 1623 (the stopping assembly) is not in contact with at least one of the movable portion M and the fixed portion F.

Moreover, as shown in FIG. 2F, a control unit C may be included in the optical element driving mechanism 1100. The control unit C may be a driver IC, a storage, or a memory, etc., and may be used for recording the first limit range, the second limit range, the third limit range, and the fourth limit range to prevent the movable portion M exceeding the limit ranges when moving to prevent damage. The first limit range, the second limit range, the third limit range, and the fourth limit range may be measured by an external apparatus (not shown), and the measured first limit range, the measured second limit range, the measured third limit range, and the measured fourth limit range will be stored in the control unit C. It should be noted that the control unit C may be electrically connected to the first position sensing assembly S1 (which includes the first position sensor 1082, the second position sensor 1084, the third position sensor 1086) and the second position sensing assembly S2 (which includes the fourth position sensor 1088 and the fifth position sensor 1089). Therefore, multiple position sensors may be controlled by one control unit C, and the number of the required control unit may be reduced to achieve miniaturization.

Figure 4A:
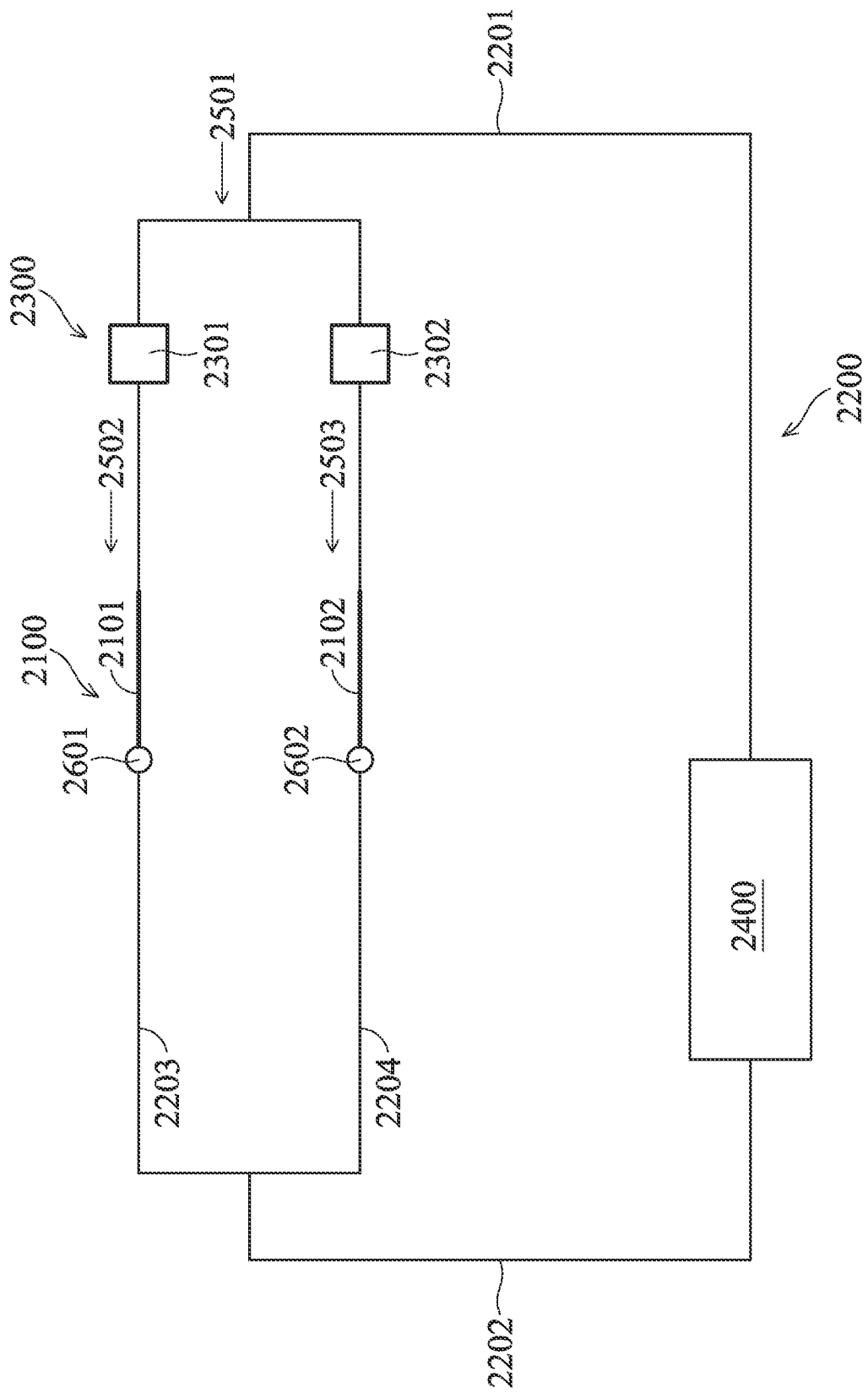
FIG. 4A is a schematic view when some elements of the optical element driving mechanism are in electrical connect with each other.

FIG. 4A is a schematic view when some elements of the optical element driving mechanism 1100 are in electrical connect with each other. For example, FIG. 4A shows the driving assembly 2100 (e.g. the driving assembly D) includes a first driving element 2101, a second driving element 2102 (e.g. the driving element 1052 and the driving element 1054), a circuit assembly 2200 (e.g. the circuit 1080), a signal adjusting assembly 2300, a control assembly 2400 (e.g. the control unit C, the first position sensing assembly S1, and the second position sensing assembly S2). It should be noted that the structure corresponding to the relationship shown in FIG. 4A is not limited to the embodiments shown in FIG. 1A to FIG. 3F, depending on design requirement. It should be noted that an accommodating space is formed between the case 1010 and the bottom 1020 to accommodate the movable portion M, and the driving assembly 2100, the circuit assembly 2200, the signal adjusting assembly 2300, and the control assembly 2400 may be disposed in the accommodating space to protect the driving assembly 2100, the circuit assembly 2200, the signal adjusting assembly 2300, and the control assembly 2400.

The first driving element 2101 and the second driving element 2102 may include shape memory alloy, or may also include electromagnetic driving element, stepper motor, or piezoelectric element. The control assembly 2400 may electrically connect to the driving assembly 2100 through the circuit assembly 2200 and the signal adjusting assembly 2300. The driving assembly 2100 may be used for driving the movable portion M to move relative to the fixed portion F. In some embodiments, the control assembly 2400 may provide a first signal 2501 to the signal adjusting assembly 2300 based on the detection results from the first position sensing assembly S1 and the second position sensing assembly S2. The signal adjusting assembly 2300 may be used for adjusting the first signal 2501 to selectively provide a second signal 2502 to the first driving element 2101 or provide a third signal 2503 to the second driving element 2102. The first driving element 2101 may generate a first driving force to the movable portion M based on the second signal 2502, and the second driving element 2102 may generate a second driving force to the movable portion M based on the third signal 2503. For example, the first driving element 2101 and the second driving element 2102 may electrically connect to the first driving element 2101 and the second circuit 2202, and the first driving element 2101 and the second circuit 2202 may electrically connect to the control assembly 2400 in some embodiments.

In some embodiments, the first circuit 2201 may be electrically connected to the second circuit 2202 through the driving assembly 2100. For example, the signal adjusting assembly 2300 may include a first electronic element 2301 and a second electronic element 2302. The first electronic element 2301 and the second electronic element 2302 may include rectifier diode, and is used for define the direction of the signal (e.g. current) passing through. For example, taking the first circuit 2201 as a standard, the rectifying directions of the first electronic element 2301 and the second electronic element 2302 may be opposite, such as when the first signal 2501 is a positive voltage or current (from the first circuit 2201 to the second circuit 2202), the first electronic element 2301 may allow the first signal 2501 to pass through and form a second signal 2502, and the second electronic element 2302 may stop the first signal 2501 to pass through. The second signal 2502 may pass through the first driving element 2101 and the third circuit 2203 that is electrically connected to the first driving element 2101 to the second circuit 2202. Therefore, the first driving element 2101 is electrically connected to the control assembly 2400 through the first circuit 2201, the second circuit 2202, the third circuit 2203, and the first electronic element 2301. The second driving element 2102 does not electrically connect to the control assembly 2400 through the first circuit 2201 and the second circuit 2202. The second signal 2502 is a positive voltage or current at this moment. In other words, the voltage at the first circuit 2201 is higher than the voltage at the second circuit 2202 at this situation.

On the contrary, when the first signal 2501 is a negative voltage or current (from the second circuit 2202 to the first circuit 2201), the first electronic element 2301 may prevent the first signal 2501 to pass through, and the second electronic element 2302 may allow the first signal 2501 to pass through and form a third signal 2503. The third signal 2503 may pass through the second driving element 2102 and the fourth circuit 2204 that is electrically connected to the second driving element 2102 to the second circuit 2202. Therefore, the first driving element 2101 does not electrically connected to the control assembly 2400 through the first circuit 2201 and the second circuit 2202. The second driving element 2102 is electrically connected to the control assembly 2400 through the first circuit 2201, the second circuit 2202, the fourth circuit 2204, and the second electronic element 2302. The third signal 2503 is a negative voltage or current at this moment. In other words, the voltage at the first circuit 2201 is lower than the voltage at the second circuit 2202 at this situation.

In some embodiments, the optical element driving mechanism 1100 may include a first clamping element 2601 and a second clamping element 2602. The first clamping element 2601 is used for fixing a first end of the first driving element 2101 that is strip-shaped, and the first clamping element 2601 is plate-shaped and is electrically connected to the third circuit 2203. The second clamping element 2602 is used for fixing a second end of the second driving element 2102 that is strip-shaped, and the second clamping element 2602 is plate-shaped and is electrically connected to the fourth circuit 2204.

Figure 4B:
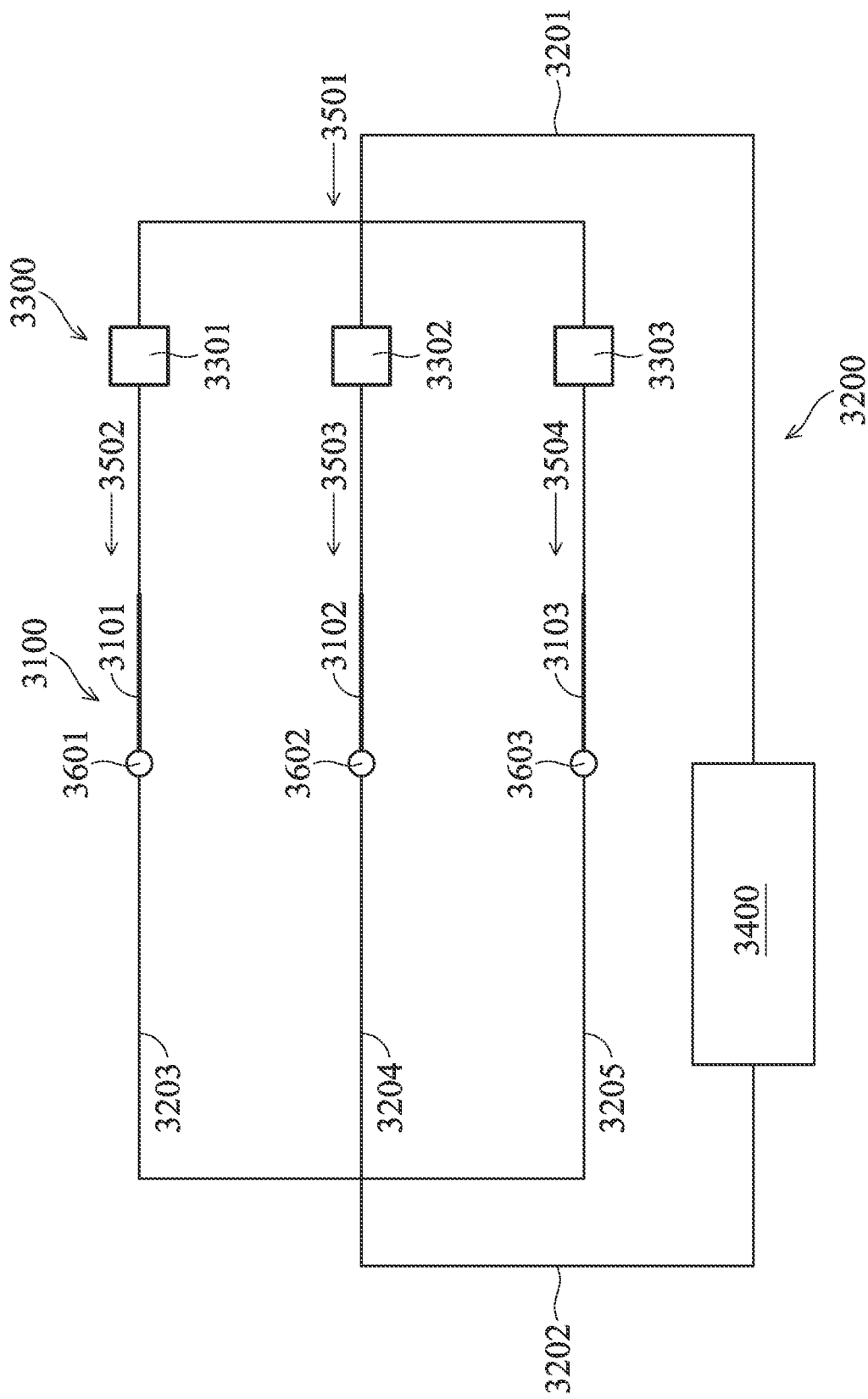
FIG. 4B is a schematic view when some elements of the optical element driving mechanism are in electrical connect with each other.

FIG. 4B is a schematic view when some elements of the optical element driving mechanism 1100 are in electrical connect with each other. The difference between the embodiments in FIG. 4A and FIG. 4B is that the embodiment in FIG. 4B further includes a third driving element 3103, a fifth circuit 3205, and a third electronic element 3303. For example, FIG. 4B shows the driving assembly 3100 (e.g. the driving assembly D) includes a first driving element 3101, a second driving element 3102, a third driving element 3103 (e.g. the driving element 1052 and the driving element 1054), a circuit assembly 3200 (e.g. the circuit 1080), a signal adjusting assembly 3300, a control assembly 3400 (e.g. the control unit C, the first position sensing assembly S1, and the second position sensing assembly S2). It should be noted that the structure corresponding to the relationship shown in FIG. 4B is not limited to the embodiments shown in FIG. 1A to FIG. 3F, depending on design requirement. It should be noted that an accommodating space is formed between the case 1010 and the bottom 1020 to accommodate the movable portion M, and the driving assembly 3100, the circuit assembly 3200, the signal adjusting assembly 3300, and the control assembly 3400 may be disposed in the accommodating space to protect the driving assembly 3100, the circuit assembly 3200, the signal adjusting assembly 3300, and the control assembly 3400.

The first driving element 3101, the second driving element 3102, and the third driving element 3103 may include shape memory alloy, or may also include electromagnetic driving element, stepper motor, or piezoelectric element. The control assembly 3400 may electrically connect to the driving assembly 3100 through the circuit assembly 3200 and the signal adjusting assembly 3300. The driving assembly 3100 may be used for driving the movable portion M to move relative to the fixed portion F. In some embodiments, the control assembly 3400 may provide a first signal 3501 to the signal adjusting assembly 3300 based on the detection results from the first position sensing assembly S1 and the second position sensing assembly S2. The signal adjusting assembly 3300 may be used for adjusting the first signal 3501 to selectively provide a second signal 3502 to the first driving element 3101, provide a third signal 3503 to the second driving element 3102, or provide a fourth signal 3504 to the third driving element 3103. The first driving element 3101 may generate a first driving force to the movable portion M based on the second signal 3502, the second driving element 3102 may generate a second driving force to the movable portion M based on the third signal 3503, and the third driving element 3103 may generate a third driving force to the movable portion M based on the fourth signal 3504. For example, the first driving element 3101, the second driving element 3102, and the third driving element 3103 may electrically connect to the first driving element 3101 and the second circuit 3202, and the first driving element 3101 and the second circuit 3202 may electrically connect to the control assembly 3400.

In some embodiments, the first circuit 3201 may be electrically connected to the second circuit 3202 through the driving assembly 3100. For example, the signal adjusting assembly 3300 may include a first electronic element 3301, a second electronic element 3302, and a third electronic element 3303. The first electronic element 3301, the second electronic element 3302, and the third electronic element 3303 may include rectifier diode, and is used for define the direction of the signal (e.g. current) passing through. For example, taking the first circuit 3201 as a standard, the rectifying directions of the first electronic element 3301, the second electronic element 3302, and the third electronic element 3303 may be identical or opposite, such as when the first signal 3501 is a positive voltage or current (from the first circuit 3201 to the second circuit 3202), the first electronic element 3301 may allow the first signal 3501 to pass through and form a second signal 3502, and the second electronic element 3302 may stop the first signal 3501 to pass through. The second signal 3502 may pass through the first driving element 3101 and the third circuit 3203 that is electrically connected to the first driving element 3101 to the second circuit 3202. In such situation, if the rectifying directions of the first electronic element 3301 and the third electronic element 3303 are identical, the third electronic element 3303 will allow the first signal 3501 to pass through and form a fourth signal 3504. In some embodiments, the fourth signal 3504 may pass through the third driving element 3103 and the fifth circuit 3205 that is electrically connected to the third driving element 3103 to reach the second circuit 3202.

Therefore, the first driving element 3101 is electrically connected to the control assembly 3400 through the first circuit 3201, the second circuit 3202, the third circuit 3203, and the first electronic element 3301. The third driving element 3103 is electrically connected to the control assembly 3400 through the first circuit 3201, the second circuit 3202, the fifth circuit 3205, and the third electronic element 3303. The second driving element 3102 does not electrically connect to the control assembly 3400 through the first circuit 3201 and the second circuit 3202. The second signal 3502 is a positive voltage or current at this moment. In other words, the voltage at the first circuit 3201 is higher than the voltage at the second circuit 3202 at this situation. However, if the rectifying directions of the first electronic element 3301 and the third electronic element 3303 are opposite, the third electronic element 3303 may prevent the first signal 3501 to pass through, so that the first signal 3501 only becomes the second signal 3502 to pass through the first driving element 3101, and does not pass through the second driving element 3102 and the third driving element 3103. The examples of the second electronic element 3302 and the third electronic element 3303 have identical or opposite rectifying directions are also similar, and will not be repeated.

In some embodiments, the optical element driving mechanism 1100 may include a first clamping element 3601, a second clamping element 3602, and a third clamping element 3603. The first clamping element 3601 is used for fixing a first end of the first driving element 3101 that is strip-shaped, and the first clamping element 3601 is plate-shaped and is electrically connected to the third circuit 3203. The second clamping element 3602 is used for fixing a second end of the second driving element 3102 that is strip-shaped, and the second clamping element 3602 is plate-shaped and is electrically connected to the fourth circuit 3204. The third clamping element 3603 is used for fixing a third end of the third driving element 3103 that is strip-shaped, and the third clamping element 3603 is plate-shaped and is electrically connected to the fifth circuit 3205.

Figure 4C:
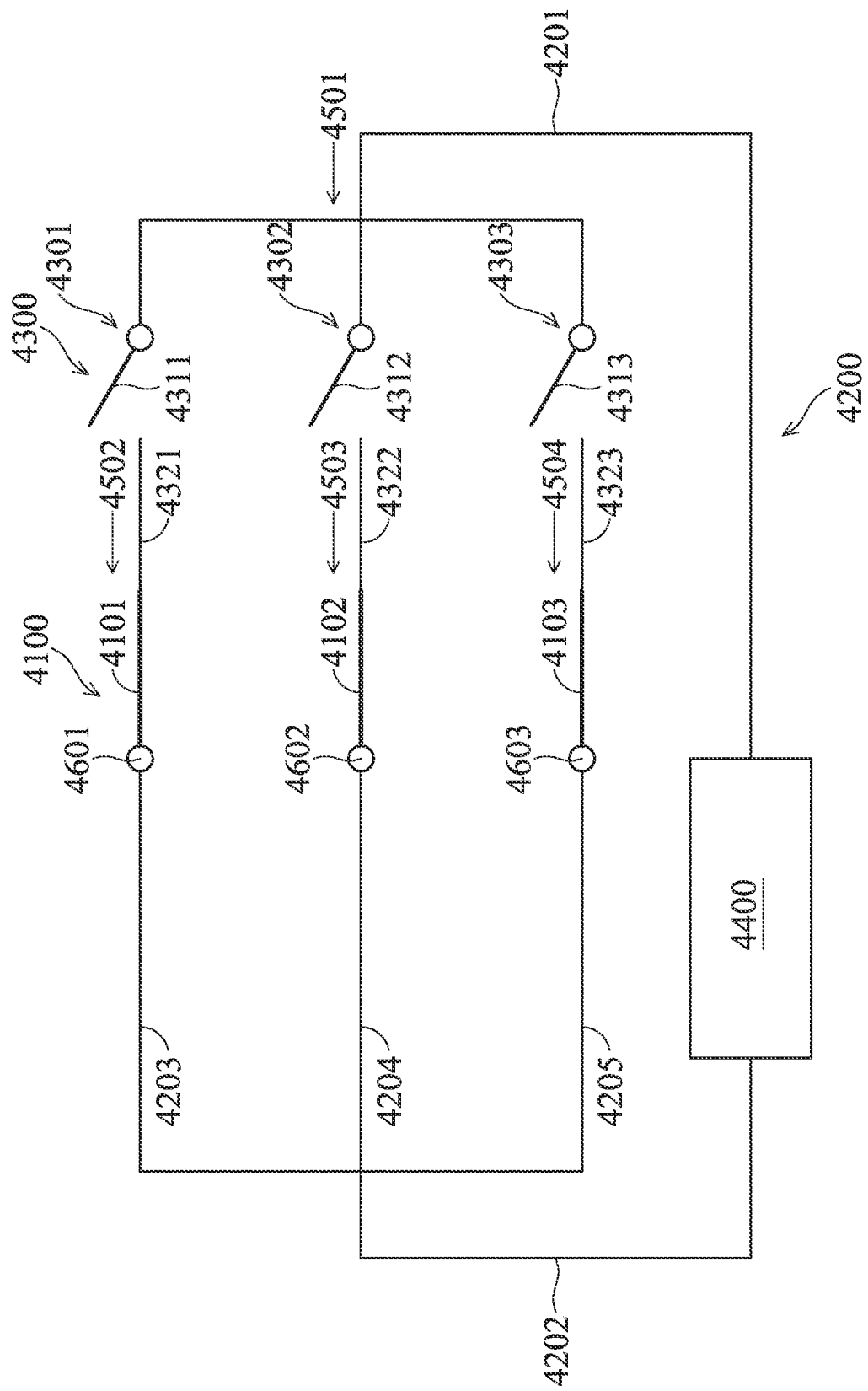
FIG. 4C is a schematic view when some elements of the optical element driving mechanism are in electrical connect with each other.

FIG. 4C is a schematic view when some elements of the optical element driving mechanism 1100 are in electrical connect with each other. The difference between the embodiments in FIG. 4B and FIG. 4C is that the embodiment in FIG. 4C uses a first switch element 4301, a second switch element 4302, and a third switch element 4303 to substitute the abovementioned electronic elements. For example, FIG. 4C shows the driving assembly 4100 (e.g. the driving assembly D) includes a first driving element 4101, a second driving element 4102, a third driving element 4103 (e.g. the driving element 1052 and the driving element 1054), a circuit assembly 4200 (e.g. the circuit 1080), a signal adjusting assembly 4300, a control assembly 4400 (e.g. the control unit C, the first position sensing assembly S1, and the second position sensing assembly S2). It should be noted that the structure corresponding to the relationship shown in FIG. 4C is not limited to the embodiments shown in FIG. 1A to FIG. 3F, depending on design requirement. It should be noted that an accommodating space is formed between the case 1010 and the bottom 1020 to accommodate the movable portion M, and the driving assembly 4100, the circuit assembly 4200, the signal adjusting assembly 4300, and the control assembly 4400 may be disposed in the accommodating space to protect the driving assembly 4100, the circuit assembly 4200, the signal adjusting assembly 4300, and the control assembly 4400 in some embodiments.

The first driving element 4101, the second driving element 4102, and the third driving element 4103 may include shape memory alloy, or may also include electromagnetic driving element, stepper motor, or piezoelectric element. The control assembly 4400 may electrically connect to the driving assembly 4100 through the circuit assembly 4200 and the signal adjusting assembly 4300. The driving assembly 4100 may be used for driving the movable portion M to move relative to the fixed portion F. In some embodiments, the control assembly 4400 may provide a first signal 4501 to the signal adjusting assembly 4300 based on the detection results from the first position sensing assembly S1 and the second position sensing assembly S2. The signal adjusting assembly 4300 may be used for adjusting the first signal 4501 to selectively provide a second signal 4502 to the first driving element 4101, provide a third signal 4503 to the second driving element 4102, or provide a fourth signal 4504 to the third driving element 4103. The first driving element 4101 may generate a first driving force to the movable portion M based on the second signal 4502, the second driving element 4102 may generate a second driving force to the movable portion M based on the third signal 4503, and the third driving element 4103 may generate a third driving force to the movable portion M based on the fourth signal 4504. For example, the first driving element 4101, the second driving element 4102, and the third driving element 4103 may electrically connect to the first driving element 4101 and the second circuit 4202, and the first driving element 4101 and the second circuit 4202 may electrically connect to the control assembly 4400.

In some embodiments, the first circuit 4201 may be electrically connected to the second circuit 4202 through the driving assembly 4100. For example, the signal adjusting assembly 4300 may include a first switch element 4301, a second switch element 4302, and a third switch element 4303. The first switch element 4301, the second switch element 4302, and the third switch element 4303 may be switches to allow or stop the current to pass through.

In some embodiments, the first switch element 4301 may be electrically connected to the third circuit 4203 to receive a first control signal provided by the control assembly 4400 to control whether the first circuit 4201 is electrically connected to the second circuit 4202 through the third circuit 4203. In some embodiments, the first switch element 4301 may include a first control circuit 4311 and a first passing circuit 4321, and the first control circuit 4311 may be electrically connected to the first circuit 4201 and is used for controlling whether the first passing circuit 4321 is in conduction to allow the first circuit 4201 electrically connect to the third circuit 4203.

In some embodiments, the second switch element 4302 may be electrically connected to the fourth circuit 4204 to receive a second control signal provided by the control assembly 4400 to control whether the first circuit 4201 is electrically connected to the second circuit 4202 through the fourth circuit 4204. In some embodiments, the second switch element 4302 may include a second control circuit 4312 and a second passing circuit 4322, and the second control circuit 4312 may be electrically connected to the first circuit 4201 and is used for controlling whether the second passing circuit 4322 is in conduction to allow the first circuit 4201 electrically connect to the fourth circuit 4204.

In some embodiments, the third switch element 4303 may be electrically connected to the fifth circuit 4205 to receive a third control signal provided by the control assembly 4400 to control whether the first circuit 4201 is electrically connected to the second circuit 4202 through the fifth circuit 4205. In some embodiments, the third switch element 4303 may include a second control circuit 4313 and a third passing circuit 4323, and the second control circuit 4313 may be electrically connected to the first circuit 4201 and is used for controlling whether the third passing circuit 4323 is in conduction to allow the first circuit 4201 electrically connect to the fifth circuit 4205.

In some embodiments, the first signal 4501 includes first information in a first timing, second information in a second timing, and third information in a third timing. The first timing, the second timing, and the third timing are at different times. The first switch element 4301 may provide the first information to the first driving element 4101, and may prevent the second information and the third information to reach the first driving element 4101. The second switch element 4302 may provide the second information to the second driving element 4102, and may prevent the first information and the third information to reach the second driving element 4102. The third switch element 4303 may provide the third information to the third driving element 4103, and may prevent the first information and the second information to reach the third driving element 4103. Therefore, the first driving element 4101, the second driving element 4102, and the third driving element 4103 may be controlled independently to prevent interference, so the driving accuracy may be improved.

In some embodiments, the optical element driving mechanism 1100 may include a first clamping element 4601, a second clamping element 4602, and a third clamping element 4603. The first clamping element 4601 is used for fixing a first end of the first driving element 4101 that is strip-shaped, and the first clamping element 4601 is plate-shaped and is electrically connected to the third circuit 4203. The second clamping element 4602 is used for fixing a second end of the second driving element 4102 that is strip-shaped, and the second clamping element 4602 is plate-shaped and is electrically connected to the fourth circuit 4204. The third clamping element 4603 is used for fixing a third end of the third driving element 4103 that is strip-shaped, and the third clamping element 4603 is plate-shaped and is electrically connected to the fifth circuit 4205.

Figure 4D:
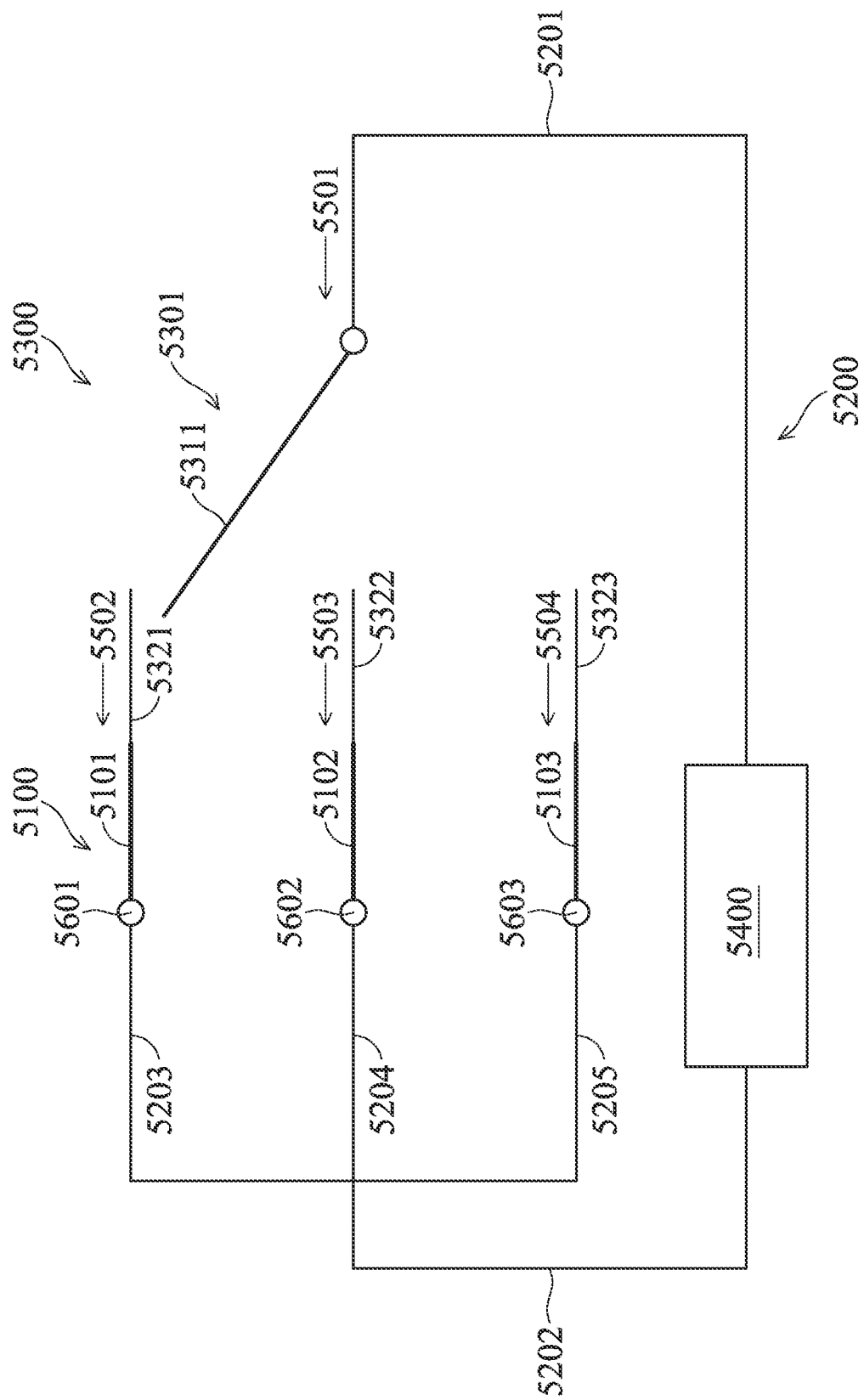
FIG. 4D is a schematic view when some elements of the optical element driving mechanism are in electrical connect with each other.

FIG. 4D is a schematic view when some elements of the optical element driving mechanism 1100 are in electrical connecting with each other. The difference between the embodiments in FIG. 4B and FIG. 4D is that the embodiment in FIG. 4D uses a first switch element 5301 to substitute the abovementioned electronic elements. For example, FIG. 4D shows the driving assembly 5100 (e.g. the driving assembly D) includes a first driving element 5101, a second driving element 5102, a third driving element 5103 (e.g. the driving element 1052 and the driving element 1054), a circuit assembly 5200 (e.g. the circuit 1080), a signal adjusting assembly 5300, a control assembly 5400 (e.g. the control unit C, the first position sensing assembly S1, and the second position sensing assembly S2). It should be noted that the structure corresponding to the relationship shown in FIG. 4D is not limited to the embodiments shown in FIG. 1A to FIG. 3F, depending on design requirement. It should be noted that an accommodating space is formed between the case 1010 and the bottom 1020 to accommodate the movable portion M, and the driving assembly 5100, the circuit assembly 5200, the signal adjusting assembly 5300, and the control assembly 5400 may be disposed in the accommodating space to protect the driving assembly 5100, the circuit assembly 5200, the signal adjusting assembly 5300, and the control assembly 5400 in some embodiments.

The first driving element 5101, the second driving element 5102, and the third driving element 5103 may include shape memory alloy, or may also include electromagnetic driving element, stepper motor, or piezoelectric element. The control assembly 5400 may electrically connect to the driving assembly 5100 through the circuit assembly 5200 and the signal adjusting assembly 5300. The driving assembly 5100 may be used for driving the movable portion M to move relative to the fixed portion F. In some embodiments, the control assembly 5400 may provide a first signal 5501 to the signal adjusting assembly 5300 based on the detection results from the first position sensing assembly S1 and the second position sensing assembly S2. The signal adjusting assembly 5300 may be used for adjusting the first signal 5501 to selectively provide a second signal 5502 to the first driving element 5101, provide a third signal 5503 to the second driving element 5102, or provide a fourth signal 5504 to the third driving element 5103. The first driving element 5101 may generate a first driving force to the movable portion M based on the second signal 5502, the second driving element 5102 may generate a second driving force to the movable portion M based on the third signal 5503, and the third driving element 5103 may generate a third driving force to the movable portion M based on the fourth signal 5504. For example, the first driving element 5101, the second driving element 5102, and the third driving element 5103 may electrically connect to the first driving element 5101 and the second circuit 5202, and the first driving element 5101 and the second circuit 5202 may electrically connect to the control assembly 5400 in some embodiments.

In some embodiments, the first circuit 5201 may be electrically connected to the second circuit 5202 through the driving assembly 5100. For example, the signal adjusting assembly 5300 may include a first switch element 5301. The first switch element 5301 may be a switch to allow or stop the current to pass through.

Figure 4E:
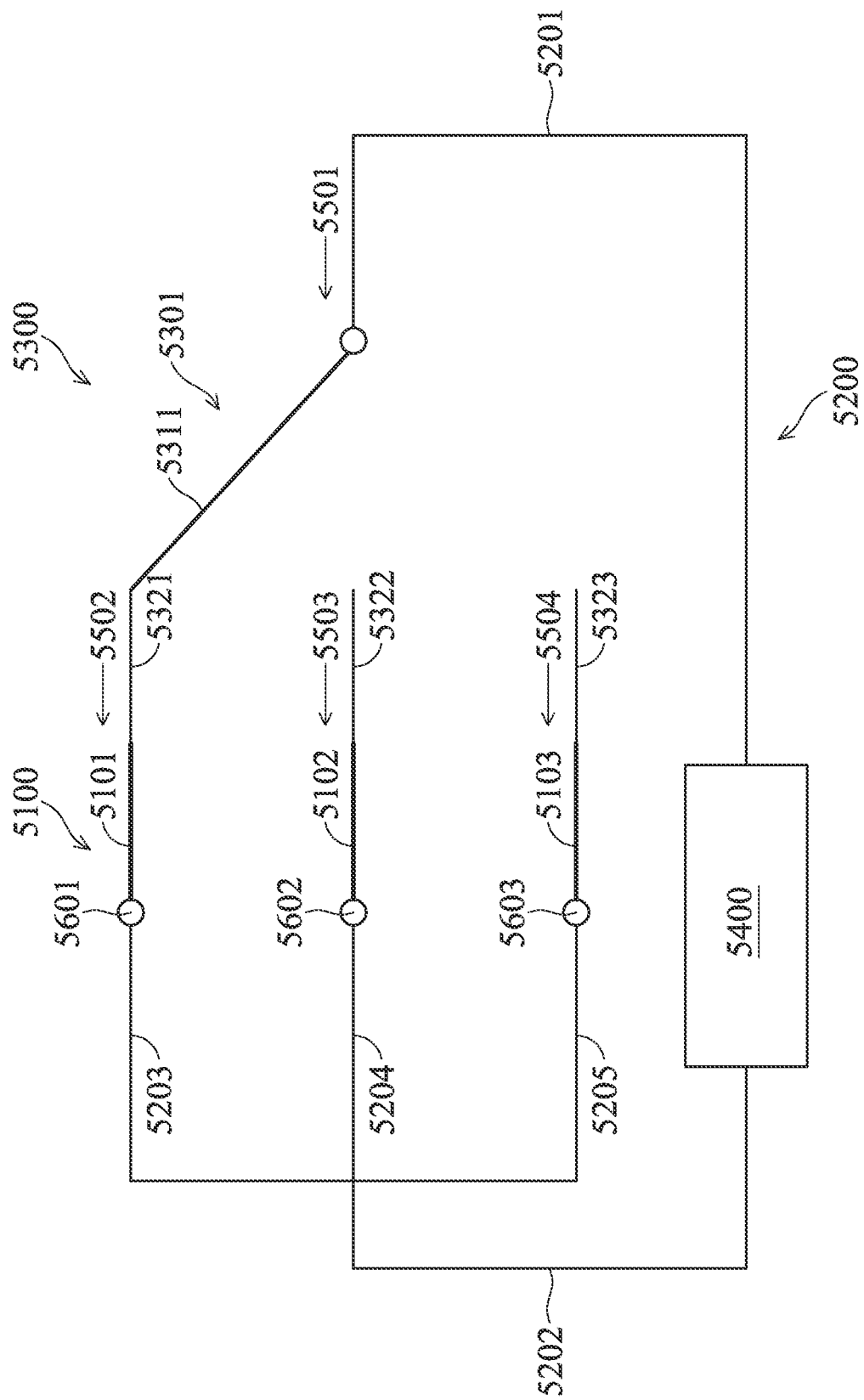
FIG. 4E shows the situation that the first switch element is electrically connected to the first passing circuit.
Figure 4F:
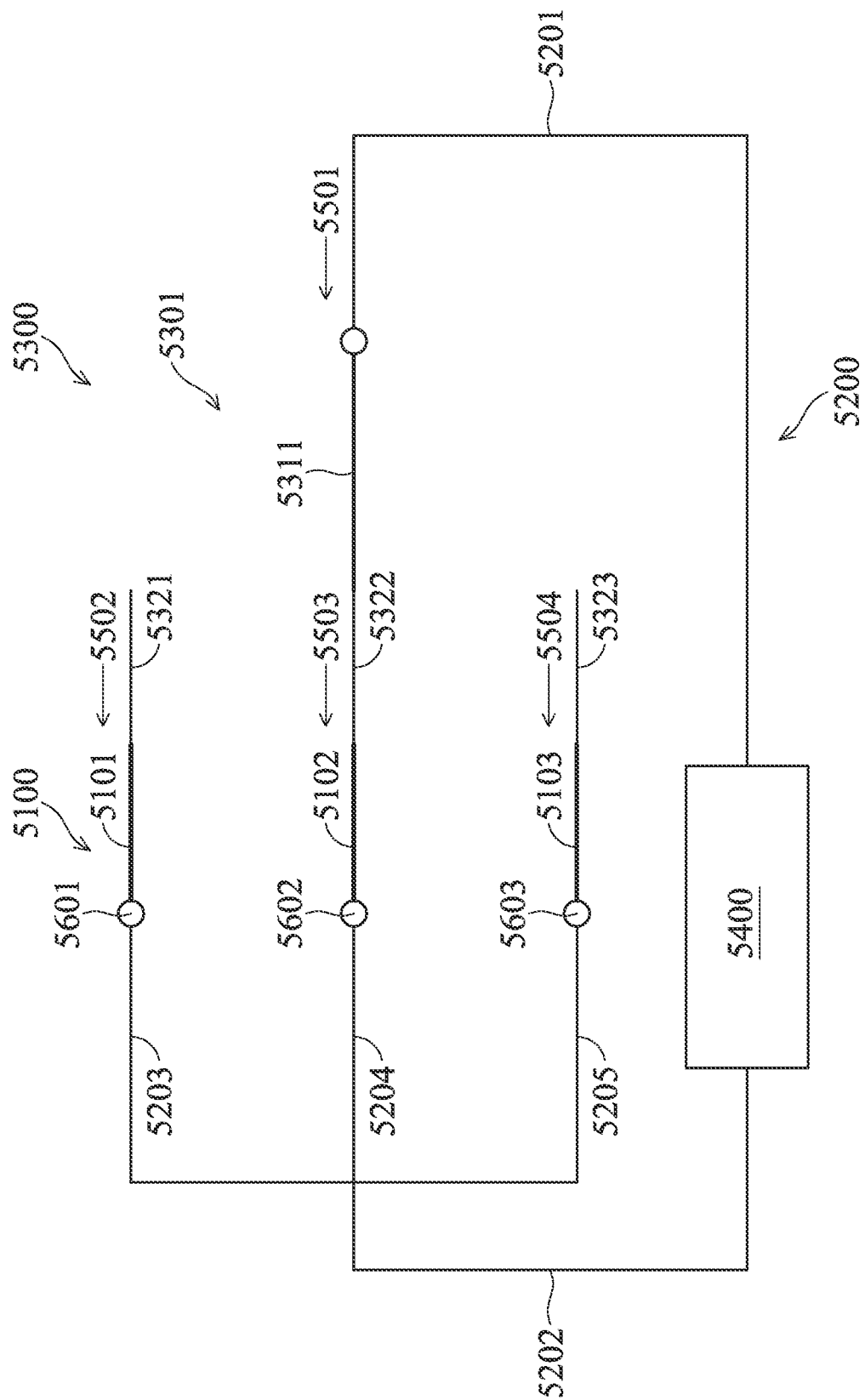
FIG. 4F shows the situation that the first switch element is electrically connected to the second passing circuit.
Figure 4G:
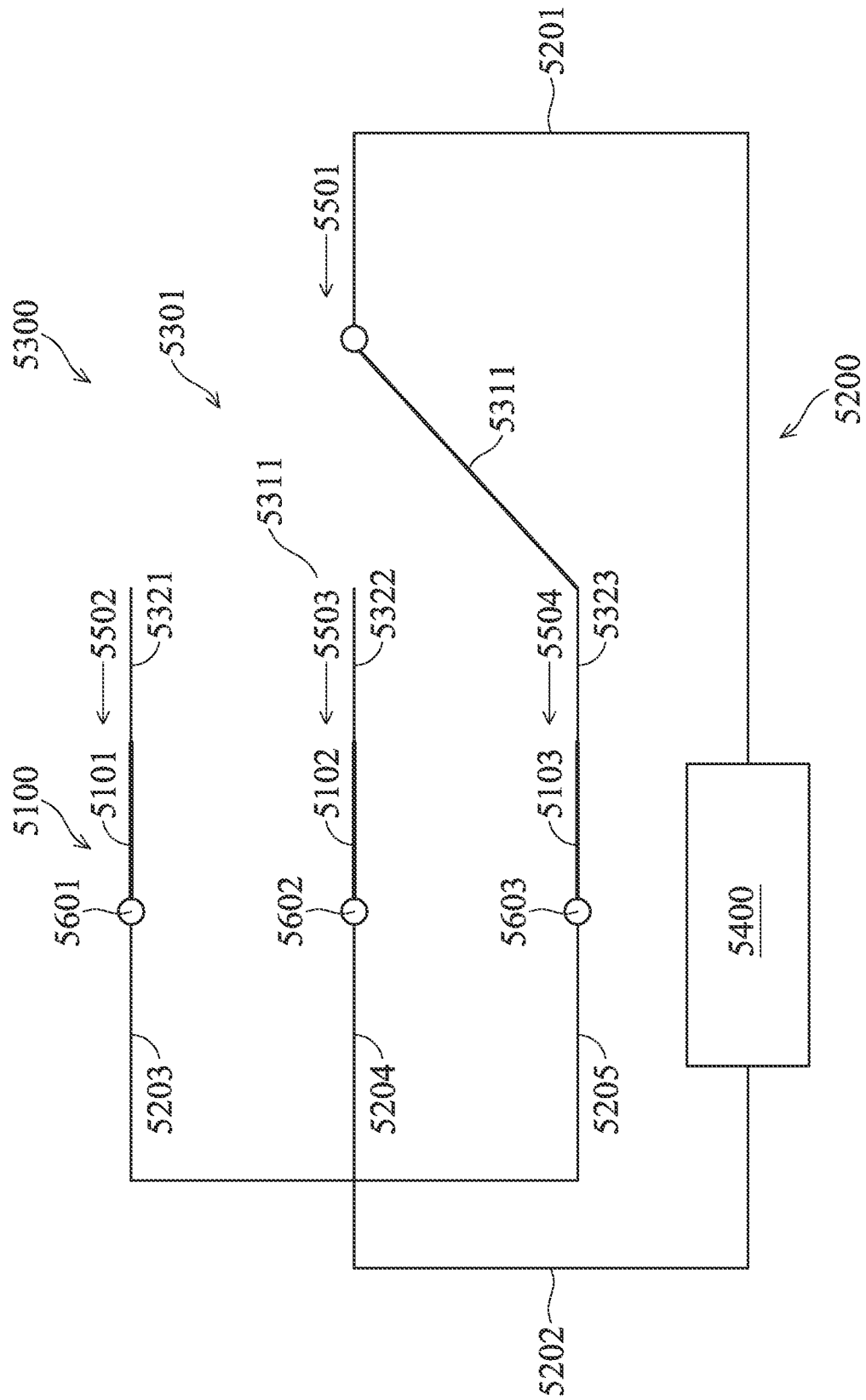
FIG. 4G shows the situation that the first switch element is electrically connected to the third passing circuit.

In some embodiments, the first switch element 5301 may include a first control circuit 5311, a first passing circuit 5321, a second passing circuit 5322, and a third passing circuit 5323. The first control circuit 5311 may be electrically connected to the first circuit 5201, the first passing circuit 5321 may be electrically connected to the first driving element 5101, the second passing circuit 5322 may be electrically connected to the second driving element 5102, the third passing circuit 5323 may be electrically connected to the third driving element 5103, and the first switch element 5301 may be electrically connected to one of the first passing circuit 5321, the second passing circuit 5322, and the third passing circuit 5323 based on a first control signal provided by the control assembly 5400. For example, FIG. 4E, FIG. 4F, and FIG. 4G show the situations that the first switch element 5301 is electrically connected to the first passing circuit 5321, the second passing circuit 5322, and the third passing circuit 5323, respectively.

In some embodiments, the first signal 5501 includes first information in a first timing, second information in a second timing, and third information in a third timing. The first timing, the second timing, and the third timing are at different times. The first switch element 5301 may provide the first information to the first driving element 5101 and prevent the second information and the third information to reach the first driving element 5101, may provide the second information to the second driving element 5102 and prevent the first information and the third information to reach the second driving element 5102, or may provide the third information to the third driving element 5103 and the first information and the second information to reach the third driving element 5103. Therefore, the first driving element 5101, the second driving element 5102, and the third driving element 5103 may be controlled independently to prevent interference, so the driving accuracy may be improved.

In some embodiments, the optical element driving mechanism 1100 may include a first clamping element 5601, a second clamping element 5602, and a third clamping element 5603. The first clamping element 5601 is used for fixing a first end of the first driving element 5101 that is strip-shaped, and the first clamping element 5601 is plate-shaped and is electrically connected to the third circuit 5203. The second clamping element 5602 is used for fixing a second end of the second driving element 5102 that is strip-shaped, and the second clamping element 5602 is plate-shaped and is electrically connected to the fourth circuit 5204. The third clamping element 5603 is used for fixing a third end of the third driving element 5103 that is strip-shaped, and the third clamping element 5603 is plate-shaped and is electrically connected to the fifth circuit 5205.

Figure 5B:
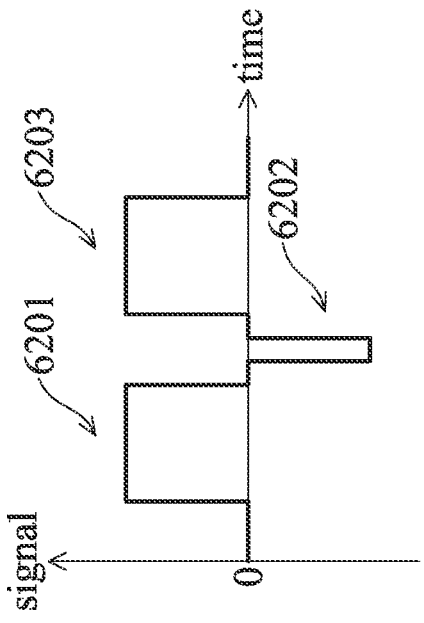
FIG. 5A to FIG. 5D are schematic views of the signal in some embodiments of the present disclosure.
Figure 5D:
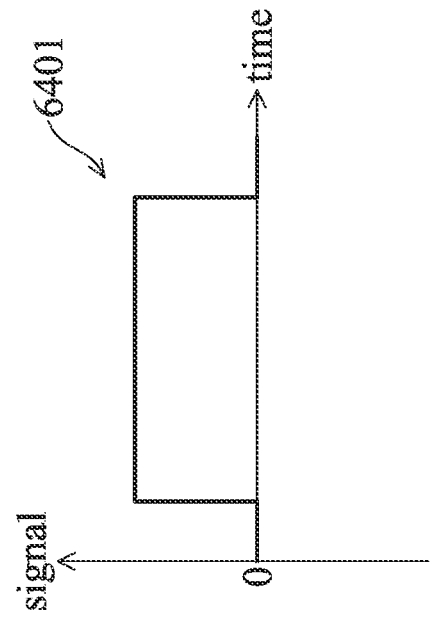
Figure 5A:
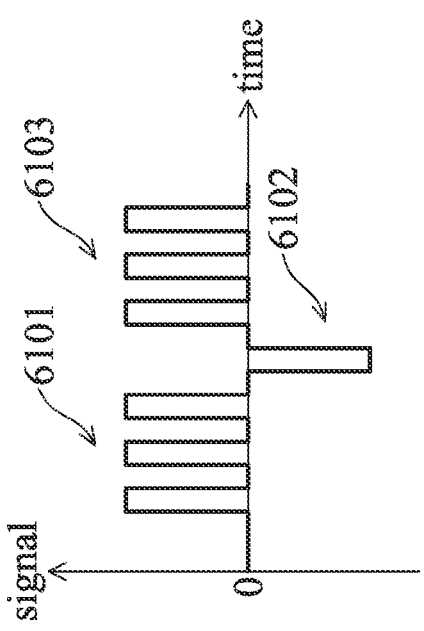

FIG. 5A to FIG. 5D are schematic views of the signal in some embodiments of the present disclosure, such as the aforementioned first signal, the second signal, the third signal, or the fourth signal. As shown in FIG. 5A, the signal includes a first information 6101, a second information 6102, and a third information 6103 that are at different times. It should be noted that the first information 6101 and the third information 6103 have positive voltage or current, and the second information 6102 has negative voltage or current. The first information 6101 and the third information 6103 may be signals that have more numbers, and the second information 6102 may be a signal has less numbers. There-fore, different signal may be provided to the driving elements in specific timings to allow the driving elements to operate.

As shown in FIG. 5B, the signal includes a first information 6201, a second information 6202, and a third information 6203 that are at different times. It should be noted that the first information 6201 and the third information 6203 have positive voltage or current, and the second information 6202 has negative voltage or current. The first information 6201 and the third information 6203 may be signals with longer duration, and the second information 6202 may be a signal has shorter duration. Therefore, different signal may be provided to the driving elements in specific timings to allow the driving elements to operate.

Figure 5C:
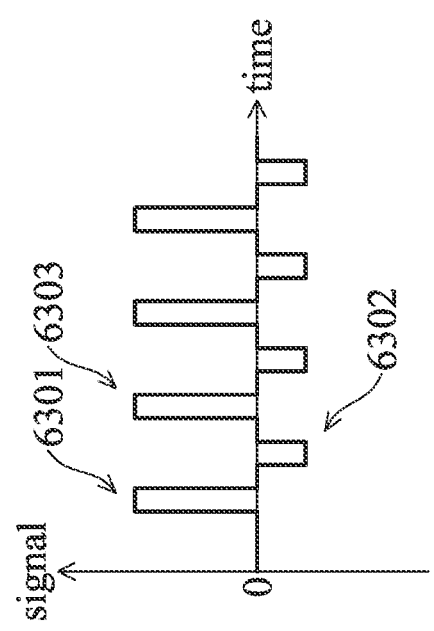

As shown in FIG. 5C, the signal includes a first information 6301, a second information 6302, and a third information 6303 that are at different times. It should be noted that the first information 6301 and the third information 6303 have positive voltage or current, and the second information 6302 has negative voltage or current. The first information 6301 and the third information 6303 may be signals with higher absolute value, and the second information 6302 may be a signal has lower absolute value. Therefore, different signal may be provided to the driving elements in specific timings to allow the driving elements to operate.

As shown in FIG. 5C, the signal includes a first information 6401 and does not include any negative signal. Therefore, the complexity of the signal may be reduced to reduce the hardness of controlling the driving elements.

In summary, a driving mechanism is provided. The driving mechanism includes a fixed portion, a movable portion, a driving assembly, a circuit assembly, and a signal adjusting assembly. The movable portion is movable relative to the fixed portion. The driving assembly is used for driving the movable portion to move relative to the fixed portion. The driving assembly is used for receiving a first signal provided by a control assembly. The driving assembly is electrically connected to the control assembly by the circuit assembly. The signal adjusting assembly is electrically connected to the driving assembly. The signal adjusting assembly is used for adjusting the first signal. Therefore, the driving elements may be controlled independents to prevent interference, so the control accuracy may be increased.

The relative positions and size relationship of the elements in the present disclosure may allow the driving mechanism achieving miniaturization in specific directions or for the entire mechanism. Moreover, different optical modules may be combined with the driving mechanism to further enhance optical quality, such as the quality of photographing or accuracy of depth detection. Therefore, the optical modules may be further utilized to achieve multiple anti-vibration systems, so image stabilization may be significantly improved.

Although embodiments of the present disclosure and their advantages already have been described in detail, it should be understood that various changes, substitutions and alterations may be made herein without departing from the spirit and the scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are also intended to include within their scope of such processes, machines, manufacture, and compositions of matter, means, methods, or steps. In addition, each claim herein constitutes a separate embodiment, and the combination of various claims and embodiments are also within the scope of the disclosure.

What is claimed is:

1. A driving mechanism, comprising:
a fixed portion;
a movable portion being movable relative to the fixed portion;
a driving assembly used for driving the movable portion to move relative to the fixed portion, wherein the driving assembly receives first signal provided by a control assembly, wherein the driving assembly comprises:
a first driving element used for generating a first driving force to the movable portion; and
a second driving element used for generating a second driving force to the movable portion;
a circuit assembly, comprising a third circuit electrically connected to the first driving element, and a fourth circuit electrically connected to the second driving element, wherein the driving assembly is electrically connected to the control assembly through the circuit assembly;
a signal adjusting assembly electrically connected to the driving assembly, wherein the signal adjusting assembly is used for adjusting the first signal;
a first clamping element used for fixing a first end of the first driving element that is strip-shaped; and
a second clamping element used for fixing a second end of the second driving element that is strip-shaped;
wherein:
the first clamping element is plate-shaped;
the second clamping element is plate-shaped;
the first clamping element is electrically connected to the third circuit; and
the second clamping element is electrically connected to the fourth circuit.

2. The driving mechanism as claimed in claim 1, wherein the circuit assembly comprises a first circuit and a second circuit;
wherein:
the first driving element and the second driving element are electrically connected to the first circuit;
the first driving element and the second driving element are electrically connected to the second circuit;
the first circuit is electrical connectable to the second circuit through the driving assembly;
the first driving element is electrical connectable to the control assembly through the first circuit;
the second driving element is electrical connectable to the control assembly through the first circuit;
the first driving element is electrical connected to the control assembly through the second circuit;
the second driving element is electrical connected to the control assembly through the second circuit.

3. The driving mechanism as claimed in claim 2, wherein the circuit assembly further comprises:
a main body being plate-shaped;
wherein:
the first circuit is electrically connectable to the second circuit through the third circuit;
the first circuit is electrically connectable to the second circuit through the fourth circuit;
the third circuit is electrically connected to the signal adjusting assembly;
the signal adjusting assembly is electrically connected to the first circuit or the second circuit through the third circuit;
the fourth circuit is electrically connected to the signal adjusting assembly;
the signal adjusting assembly is electrically connected to the first circuit or the second circuit through the fourth circuit;
the driving mechanism further comprises:
the first clamping element is electrically connected to the third circuit;
the second clamping element is electrically connected to the fourth circuit;
the fixed portion further comprises a case and a bottom forming an accommodating space for accommodating the movable portion;
the case comprises a top wall and a side wall;
the circuit assembly is disposed in the accommodating space;
the control assembly is disposed in the accommodating space;
the first circuit, the second circuit, the third circuit, and the fourth circuit are disposed on the main body.

4. The driving mechanism as claimed in claim 3, wherein:
the movable portion is used for connecting to an optical element;
the first driving element comprises shape memory alloy;
the second driving element comprises shape memory alloy;
the control assembly further comprises a first sensing assembly and a second sensing assembly used for detecting the movement of the movable portion relative to the fixed portion;
the control assembly provides the first signal based on the sensing result of the first sensing assembly;
the control assembly provides the first signal based on the sensing result of the second sensing assembly.

5. The driving mechanism as claimed in claim 4, wherein:
the signal adjusting assembly is used for adjusting the first signal to be a second signal, and then providing to the first driving element;
the signal adjusting assembly is used for adjusting the first signal to be a third signal, and then providing to the second driving element;
the second signal comprises positive voltage or current, or comprises negative voltage or current;
the third signal comprises positive voltage or current, or comprises negative voltage or current;
the signal adjusting assembly comprises a first electronic element and a second electronic element;
the first electronic element has rectifying function;
the first electronic element is electrically connected to the third circuit and the first driving element;
the second electronic element has rectifying function;
the second electronic element is electrically connected to the fourth circuit and the second driving element;
when taking the first circuit as a standard, rectifying directions of the first electronic element and the second electronic element are opposite.

6. The driving mechanism as claimed in claim 5, wherein:
the first signal comprises first information at a first timing;
the first signal comprises second information at a second timing;

the first timing and the second timing are at different times;

the first signal that comprises the first information passes through the first electronic element to reach the first driving element during the first timing;

the first signal that comprises the second information passes through the second electronic element to reach the second driving element during the second timing.

7. The driving mechanism as claimed in claim 5, wherein the driving assembly further comprises a third driving element used for generating a third driving force to the movable portion;

the third driving element is electrically connected to the first circuit;

the third driving element is electrically connectable to the second circuit;

the third circuit is electrically connectable to the second circuit through the third driving element;

the third driving element is electrically connected to the control assembly through the first circuit;

the third driving element is electrically connectable to the control assembly through the second circuit;

the circuit assembly further comprises a fifth circuit electrically connected to the third driving element;

the first circuit is electrically connectable to the second circuit through the fifth circuit;

the fifth circuit is electrically connected to the signal adjusting assembly;

the signal adjusting assembly is electrically connected to the first circuit or the second circuit through the fifth circuit;

the material of the third driving element comprises shape memory alloy.

8. The driving mechanism as claimed in claim 4, wherein the signal adjusting assembly comprises a first switch element electrically connected to the third circuit and used for controlling whether the first circuit is electrically connected to the second circuit by the third circuit;

the first switch element comprises:
  a first passing circuit electrically connected to the third circuit; and
  a first control circuit used for controlling whether the first passing circuit is in conduction;

the first control circuit receives a first control signal provided by the control assembly;

the first signal comprises first information at a first timing and a second information at a second timing, wherein the first timing and the second timing are at different times;

the first switch element allows the first information to the first driving element based on the first control signal;

the first switch element prevents the second information to the first driving element based on the first control signal.

9. The driving mechanism as claimed in claim 8, wherein the signal adjusting assembly further comprises a second switch element used for controlling whether the first circuit is electrically connected to the second circuit by the fourth circuit;

the second switch element comprises:
  a second passing circuit electrically connected to the fourth circuit; and
  a second control circuit used for controlling whether the second passing circuit is in conduction;

the second control circuit receives a second control signal provided by the control assembly;

the second switch element prevents the first information to the second driving element based on the second control signal;

the second switch element allows the second information to the second driving element based on the second control signal.

10. The driving mechanism as claimed in claim 9, wherein the signal adjusting assembly further comprises a third switch element electrically connected to the fifth circuit and used for controlling whether the first circuit is electrically connected to the second circuit by the fifth circuit;

the third switch element comprises:
  a third passing circuit electrically connected to the fifth circuit; and
  a third control circuit used for controlling whether the third passing circuit is in conduction;

the third control circuit receives a third control signal provided by the control assembly;

the first signal comprises third information at a third timing, wherein the third timing, the first timing, and the second timing are at different times;

the third switch element prevents the first information to the third driving element based on the third control signal;

the first switch element prevents the second information to the third driving element based on the third control signal.

11. The driving mechanism as claimed in claim 8, wherein the first switch element further comprises a second passing circuit electrically connected to the fourth circuit;

the first control circuit is used for controlling whether the second passing circuit is in electrical connection;

the first switch element allows or prevents the first information to the first driving element;

the first switch element allows or prevents the second information to the second driving element.

12. The driving mechanism as claimed in claim 11, wherein the first switch element further comprises a third passing circuit electrically connected to the fifth circuit;

the first signal comprises third information at a third timing, wherein the third timing, the first timing, and the second timing are at different times;

the first switch element allows the third information to the third driving element;

the first switch element prevents the first information to the third driving element;

the first switch element prevents the second information to the third driving element.

* * * * *